(12) United States Patent
Takahashi et al.

(10) Patent No.: US 9,204,070 B2
(45) Date of Patent: Dec. 1, 2015

(54) INTEGRATING A/D CONVERTER, INTEGRATING A/D CONVERSION METHOD, SOLID-STATE IMAGING DEVICE AND CAMERA SYSTEM

(75) Inventors: Tomohiro Takahashi, Kanagawa (JP); Hiroki Ui, Tokyo (JP); Junichi Inutsuka, Kanagawa (JP); Nozomu Takatori, Nagasaki (JP)

(73) Assignee: Sony Corporation, Tokyo (JP)

( * ) Notice: Subject to any disclaimer, the term of this patent is extended or adjusted under 35 U.S.C. 154(b) by 724 days.

(21) Appl. No.: 13/064,910

(22) Filed: Apr. 26, 2011

(65) Prior Publication Data

US 2011/0292265 A1  Dec. 1, 2011

(30) Foreign Application Priority Data

Jun. 1, 2010  (JP) ................. 2010-126069

(51) Int. Cl.
*H04N 5/335* (2011.01)
*H04N 5/378* (2011.01)
*H04N 5/3745* (2011.01)
*H03M 1/50* (2006.01)
*H03M 1/12* (2006.01)
*H03M 1/14* (2006.01)
*H03M 1/56* (2006.01)
*H03M 1/60* (2006.01)

(52) U.S. Cl.
CPC ............. *H04N 5/378* (2013.01); *H03M 1/502* (2013.01); *H04N 5/3745* (2013.01); *H03M 1/123* (2013.01); *H03M 1/14* (2013.01); *H03M 1/56* (2013.01); *H03M 1/60* (2013.01)

(58) Field of Classification Search
USPC .............. 326/22, 62; 327/205, 206, 194, 333; 348/308, 340; 341/164
See application file for complete search history.

(56) References Cited

U.S. PATENT DOCUMENTS

| | | | | |
|---|---|---|---|---|
| 5,959,487 A | * | 9/1999 | Kawamura | 327/270 |
| 5,990,700 A | * | 11/1999 | Park | 326/22 |
| 2005/0184762 A1 | * | 8/2005 | Yuki et al. | 327/77 |
| 2005/0195238 A1 | | 9/2005 | Eguchi et al. | |
| 2009/0040352 A1 | * | 2/2009 | Kawaguchi | 348/308 |
| 2010/0091167 A1 | * | 4/2010 | Azami | 348/340 |

FOREIGN PATENT DOCUMENTS

| | | |
|---|---|---|
| JP | 2005-229263 | 8/2005 |
| JP | 2005-323331 | 11/2005 |
| JP | 2008-092091 | 4/2008 |

* cited by examiner

*Primary Examiner* — Roberto Velez
*Assistant Examiner* — Stephen Coleman
(74) *Attorney, Agent, or Firm* — Sony Corporation

(57) ABSTRACT

An integrating A/D converter includes: a comparator comparing an input voltage to a reference voltage having a ramp waveform, a voltage value of which linearly varies with time; a higher-order bit counter starting operation or stopping operation triggered by inversion of an output signal of the comparator and outputting higher order bits by performing counting in a cycle of a clock signal; and a time-to-digital converter latching phase information of the clock signal corresponding to plural signals obtained by delaying an output signal of the comparator and decoding the latched values to output lower order bits having higher resolution than the clock cycle.

24 Claims, 18 Drawing Sheets

RIPPLE COUNTER OPERATION

AD PERIOD $2^n T = \dfrac{2^n}{f} = H[s]$

RIPPLE COUNTER OPERATION

AD PERIOD $2^{n+1}T = \dfrac{2^{n+1}}{f} = 2\dfrac{2^n}{f} = H[s]$

FIG.13

| EB[1] | EB[0] | DECODE VALUE | |
|---|---|---|---|
| | | Bin. | Dec. |
| 1 | 1 | 00 | +0 |
| 1 | 0 | 01 | +1 |
| 0 | 0 | 10 | +2 |
| 0 | 1 | 11 | +3 |

| EB[3] | EB[2] | EB[1] | EB[0] | DECODE VALUE ||
| --- | --- | --- | --- | --- | --- |
| | | | | Bin. | Dec. |
| 1 | 1 | 1 | 1 | 000 | +0 |
| 1 | 1 | 1 | 0 | 001 | +1 |
| 1 | 1 | 0 | 0 | 010 | +2 |
| 1 | 0 | 0 | 0 | 011 | +3 |

| EB[3] | EB[2] | EB[1] | EB[0] | DECODE VALUE ||
| --- | --- | --- | --- | --- | --- |
| | | | | Bin. | Dec. |
| 0 | 0 | 0 | 0 | 100 | +4 |
| 0 | 0 | 0 | 1 | 101 | +5 |
| 0 | 0 | 1 | 1 | 110 | +6 |
| 0 | 1 | 1 | 1 | 111 | +7 |

US 9,204,070 B2

INTEGRATING A/D CONVERTER, INTEGRATING A/D CONVERSION METHOD, SOLID-STATE IMAGING DEVICE AND CAMERA SYSTEM

BACKGROUND OF THE INVENTION

1. Field of the Invention

The present invention relates to an integrating A/D converter capable of being applied to a solid-state imaging device typified by a CMOS image sensor, an integrating A/D conversion method, a solid-state imaging device and a camera system.

2. Description of the Related Art

A configuration in which integrating analog/digital converters (hereinafter referred to as A/D converters (Analog Digital converters)) are arranged in parallel in respective columns of an image sensor is proposed (refer to JP-A-2005-323331 (Patent Document 1)).

FIG. 1 is a diagram showing a block configuration of the integrating A/D converter taken out as one column shown in Patent Document 1.

An integrating A/D converter 1 includes a comparator 2, a ripple counter 3 and a transfer bus 4.

In the integrating A/D converter 1, a reference voltage (reference signal) RAMP having a ramp waveform, voltage value of which linearly varies with time is compared to an input voltage VSL in the comparator 2 and the comparison result is outputted as a signal VCO.

Operation of the ripple counter 3 is started or stopped at the timing when the signal VCO varies, and voltage variation is converted into a digital value by counting count periods.

SUMMARY OF THE INVENTION

In the integrating A/D converter 1, it is necessary to increase the count of the counter in the same voltage variation for increasing resolution.

FIGS. 2A and 2B are diagrams for explaining a case where the count in the counter is increased for increasing resolution in the integrating A/D converter of FIG. 1.

For example, assume that the resolution of the integrating A/D converter performing A/D conversion in a period H [s] by using a clock frequency f [Hz] is increased by 1-bit.

When the conversion period is to be maintained in H [s], it is necessary to increase the frequency of a clock signal CLK to be double which is 2f [Hz] for increasing the count of the counter to be double as shown in FIG. 2A.

On the other hand, when the clock frequency is to be maintained at f [Hz], the conversion period will be double which is 2H [s] for increasing the count of the counter to be double as shown in FIG. 2B.

When the clock frequency is increased, current consumption of the clock is drastically increased.

When the conversion period is doubled, a frame rate is reduced.

As described above, the integrating A/D converter has a problem that trade-off of performance is large in principle. Therefore, a technique for increasing resolution while maintaining the clock frequency is desired.

In response to the above problem, an integrating A/D converter realizing high-speed conversion while maintaining resolution is proposed in JP-A-2005-229263 (Patent Document 2).

In the system shown in Patent Document 2, a ring oscillator is oscillated by a signal indicating the start of the A/D conversion period to allow the counter to be operated by using the oscillating signal as a reference clock.

Plural signals in intermediate stages of the ring oscillator are taken out as phase information of a pulse signal, and the phase information is latched at the same time by using a signal indicating the end of the A/D conversion period as a trigger to thereby obtain resolution higher than the clock frequency.

In other words, the signals in intermediate stages of the ring oscillator in the system are clocks obtained by shifting the phase with respect to the reference clock counting the count, and plural clocks having different phases are latched at the same time by using the signal of the comparison result.

Additionally, there is proposed a system in JP-A-2008-92091 (Patent Document 3), in which clock signals having different phases are generated by the ring oscillator and are latched by the signal of the comparison result to obtain phase information and increase resolution.

In the system, the ring oscillator and the integrating A/D converter are separated, therefore, an application example to a column AD system of the image sensor is also presented.

The system of the A/D conversion is the same as the system proposed in Patent Document 2 concerning a point where clocks having different phases are distributed to A/D converters and plural clocks are latched all at once by using the signal of the comparison result to obtain phase information.

Thus, it is desirable to provide an integrating A/D converter, an integrating A/D conversion method, a solid-state imaging device and a camera system with a small trade-off and capable of improving resolution without increasing the clock frequency.

According to an embodiment of the invention, there is provided an integrating A/D converter including a comparator comparing an input voltage to a reference voltage having a ramp waveform, a voltage value of which linearly varies with time, a higher-order bit counter starting operation or stopping operation triggered by inversion of an output signal of the comparator and outputting higher order bits by performing counting in a cycle of a clock signal, and a time-to-digital converter latching phase information of the clock signal corresponding to plural signals obtained by delaying an output signal of the comparator and decoding the latched values to output lower order bits having higher resolution than the clock cycle.

According to another embodiment of the invention, there is provided an integrating A/D conversion method including the steps of comparing an input voltage to a reference voltage having a ramp waveform, a voltage value of which linearly varies with time by a comparator, starting operation or stopping operation triggered by inversion of an output signal of the comparator and outputting higher order bits by a counter performing counting in a cycle of a clock signal, and latching phase information of the clock signal corresponding to plural signals obtained by delaying an output signal of the comparator and decoding the latched values to output lower order bits having higher resolution than the clock cycle.

According to still another embodiment of the invention, there is provided a solid-state imaging device including a pixel unit in which plural pixels performing photoelectric conversion are arranged in a matrix state, and a pixel signal reading unit performing reading of pixel signals from the pixel unit in units of plural pixels, in which the pixel signal reading unit includes integrating analog/digital (A/D) converters converting the read analog signals to digital signals so as to correspond to column arrangement of pixels, and in which the integrating A/D converter includes a comparator comparing an input voltage to a reference voltage having a ramp waveform, a voltage value of which linearly varies with time, a higher-order bit counter starting operation or stopping operation triggered by inversion of an output signal of the comparator and outputting higher order bits by performing counting in a cycle of a clock signal, and a time-to-digital converter latching phase information of the clock signal corresponding to plural signals obtained by delaying an output signal of the comparator and decoding the latched values to output lower order bits having higher resolution than the clock cycle.

According to yet another embodiment of the invention, there is provided a camera system including a solid-state imaging device and an optical system imaging a subject image on the solid-state imaging device, in which the solid-state imaging device includes a pixel unit in which plural pixels performing photoelectric conversion are arranged in a matrix state, and a pixel signal reading unit performing reading of pixel signals from the pixel unit in units of plural pixels, and in which the pixel signal reading unit includes integrating analog/digital (A/D) converters converting the read analog signals to digital signals so as to correspond to column arrangement of pixels, and further, the integrating A/D converter includes a comparator comparing an input voltage to a reference voltage having, a ramp waveform, a voltage value of which linearly varies with time, a higher-order bit counter starting operation or stopping operation triggered by inversion of an output signal of the comparator and outputting higher order bits by performing counting in a cycle of a clock signal, and a time-to-digital converter latching phase information of the clock signal corresponding to plural signals obtained by delaying an output signal of the comparator and decoding the latched values to output lower order bits having higher resolution than the clock cycle.

According to the embodiments of the invention, trade-off of performance is small and the resolution can be increased without increasing the clock frequency.

BRIEF DESCRIPTION OF THE DRAWINGS

FIG. 13 is a chart collectively showing combinations of extended codes and values to be decoded when 2-bit resolution is obtained;

DESCRIPTION OF THE PREFERRED EMBODIMENTS

Hereinafter, embodiments of the invention will be explained with reference to the drawings.

The explanation will be made in the following order.
1. First Embodiment (First configuration example of an integrating A/D converter)
2. Second Embodiment (Second configuration example of the integrating A/D converter)
3. Third Embodiment (Third configuration example of the integrating A/D converter)
4. Fourth Embodiment (Entire configuration example of a solid-state imaging device)
5. Fifth Embodiment (Configuration example of a camera system)<

1. First Embodiment

First Configuration Example of an Integrating A/D Converter

Figure 1:
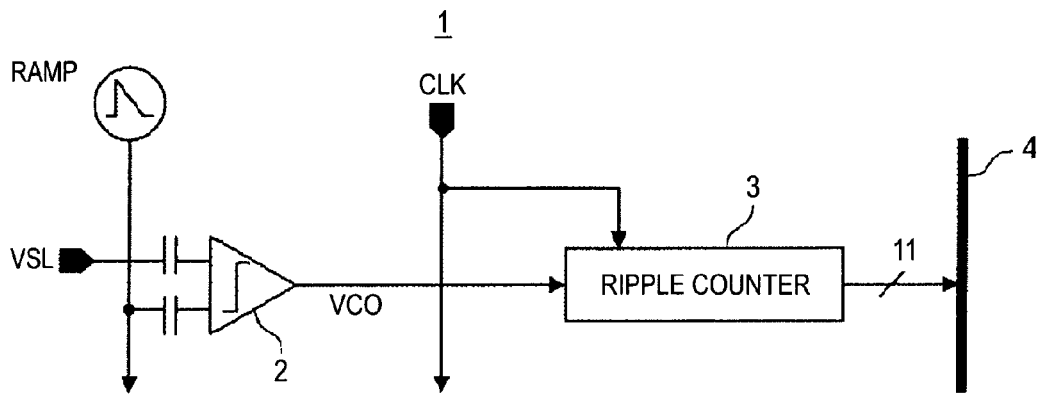
FIG. 1 is a diagram showing a block configuration of the integrating A/D converter taken out as one column shown in Patent Document 1.
Figure 2A:
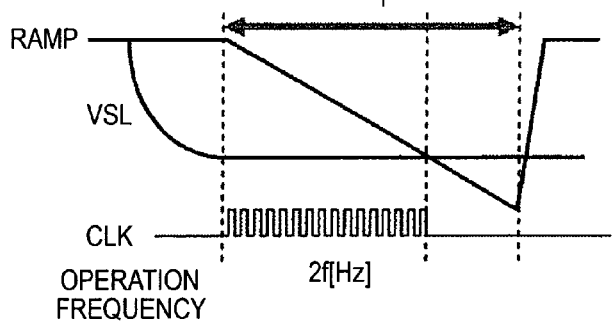
FIGS. 2A and 2B are diagrams for explaining a case in which count in a counter is increased for increasing resolution at the integrating A/D converter of FIG. 1.
Figure 2B:
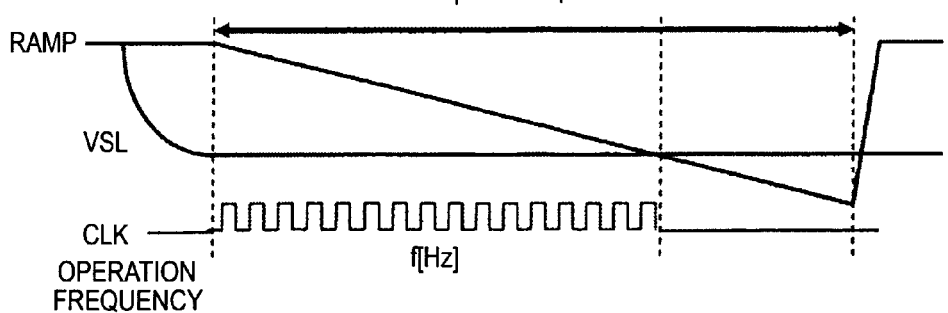
Figure 3:
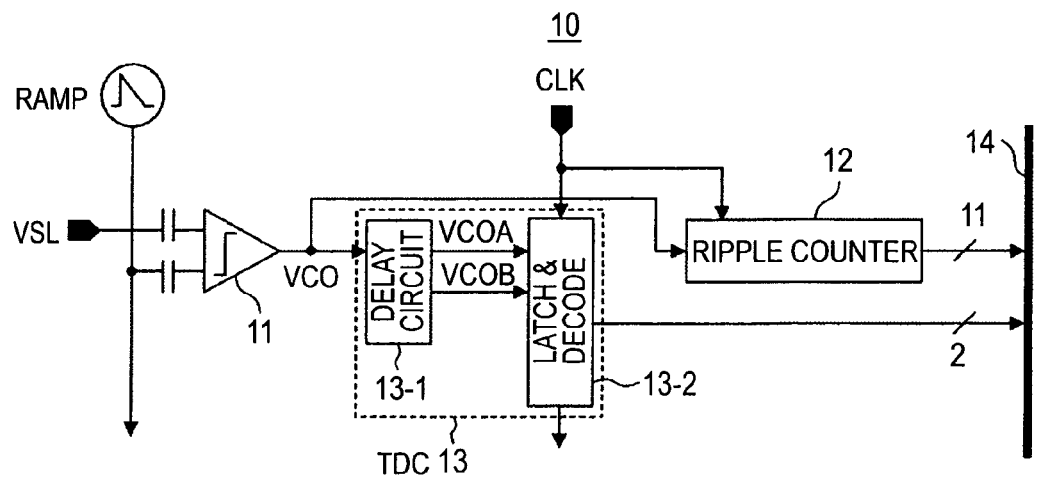
FIG. 3 is a diagram showing a configuration example of an integrating A/D converter according to a first embodiment of the invention.

FIG. 3 is a diagram showing a configuration example of an integrating A/D converter according to a first embodiment of the invention.

An A/D converter 10 according to the first embodiment includes a comparator 11, a ripple counter 12 as a higher-order bit counter, a time-to-digital converter (TDC) 13 and a transfer bus 14.

The comparator 11 compares a reference voltage (reference signal) RAMP having a ramp waveform, a voltage value of which linearly varies with time is compared to an input voltage VSL and a signal VCO corresponding to the result to the ripple counter 12 and the TDC 13.

The ripple counter 12 basically starts operation or stops operation triggered by an inversion of the output signal VCO of the comparator 11, which functions as a higher-order bit counter performing counting in a cycle of a clock signal CLK.

The TDC 13 latches phase information of the clock signal CLK and decodes the latched values to thereby output a lower order bits having higher resolution than the clock cycle.

The TDC 13 has 2-bit resolution.

Here, assume that the frequency of the clock signal CLK is f [Hz] and the cycle thereof is T [s].

When n-bit resolution is desired to be obtained in the TDC 13, it is necessary that there are $2^{n-1}$ signals VCO having delay time difference and that a delay interval is $T/2^n$ [s].

When 2-bit resolution is obtained such as in the first embodiment, signals VCO having the delay time difference are two signals VCOA, VOCB, and the delay interval therebetween is T/4 [s].

The TDC 13 includes a delay circuit 13-1 as a delay unit and a latch & decode unit 13-2.

The delay circuit 13-1, when receiving an output signal VCO of the comparator 11, generates the signals VCOA, VCOB having fixed delay time difference and outputs the signals to the latch & decode unit 13-2.

The latch & decode unit 13-2 latches the clock signal CLK in synchronization with the signals VCOA, VCOB outputted from the delay circuit 13-1 with the delay time difference and stores the latched values as extended codes EB [1], EB [0] indicating phase information.

The latch & decode unit 13-2 obtains an A/D conversion result smaller than the clock cycle by decoding the stored extended codes EB [1], EB [0].

Here, a specific configuration example of the delay circuit which delays the output signal VCO of the comparator 11 to be a key for acquiring phase information will be explained.

Here, an example in which the resolution of the TDC 13 is 2-bit is shown.

There are roughly two principles for generating delay in the signal VCO.

One of them is a first method of using a slope possessed by the signal VCO itself as waveform variation of the output signal VCO by comparison between the reference signal RAMP and the pixel signal VSL in the comparator 11 is extremely gradual.

The other one is a second method of delaying the variation itself of the signal VCO.

Two configurations will be shown as examples of the former first method and one configuration will be shown as an example of the latter second method.

[First Configuration Example of the Delay Circuit]

Figure 4:
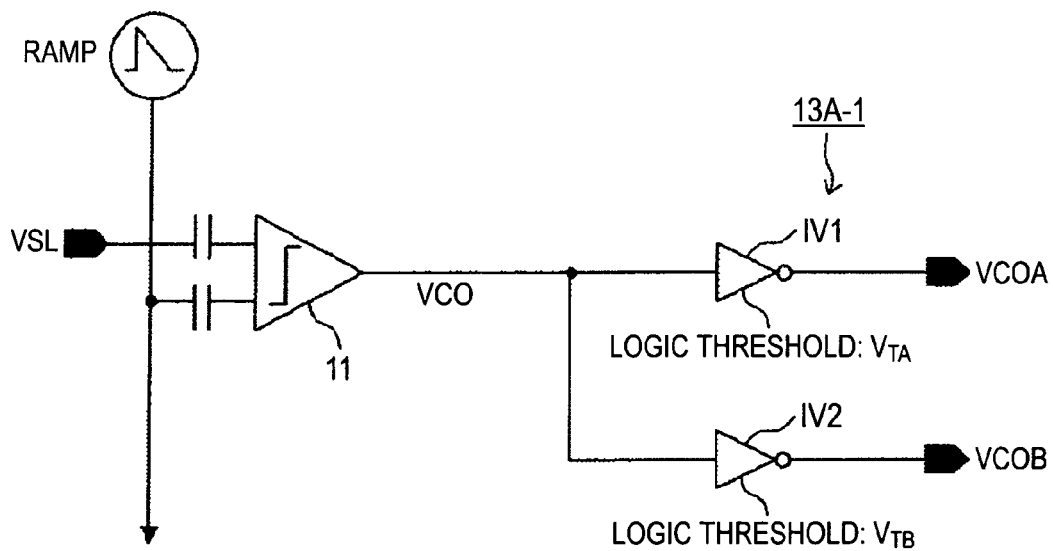
FIG. 4 explains a first configuration example of a delay circuit according to the embodiment.

FIG. 4 explains a first configuration example of the delay circuit according to the embodiment.

Figure 5:
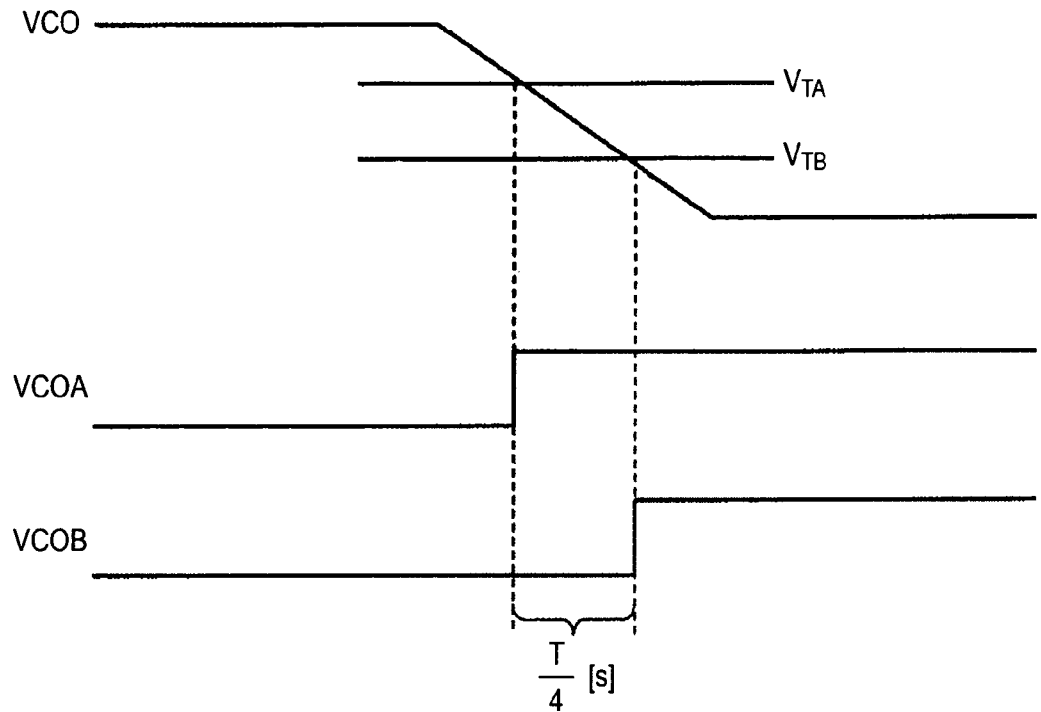
FIG. 5 is a diagram showing operation waveforms obtained when the delay circuit of FIG. 4 is applied.

FIG. 5 is a diagram showing operation waveforms obtained when the delay circuit of FIG. 4 is applied.

Figure 6:
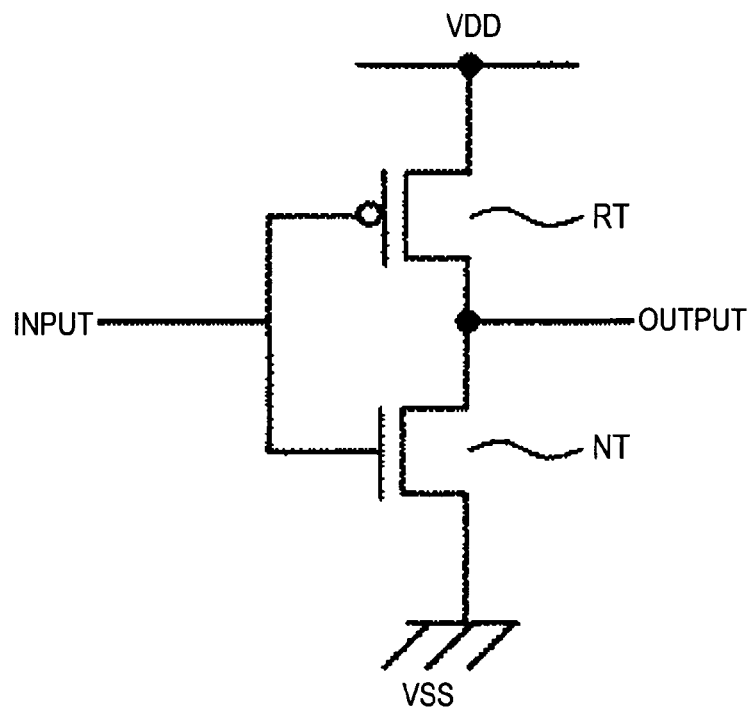
FIG. 6 is a diagram showing a basic configuration of an inverter.

FIG. 6 is a diagram showing a basic configuration of an inverter.

A delay circuit 13A-1 of FIG. 4 is configured as a circuit generating delay difference by using inverters IV1, IV2 having different logic threshold voltages.

An inverter IV is basically configured by connecting a p-channel MOS (PMOS) transistor PT and an n-channel MOS (NMOS) transistor NT in series between a power supply VDD and a reference potential VSS as shown in FIG. 6.

Then, the inverters IV1, IV2 can change a logic threshold value by changing the size balance between PMOS and NMOS.

In the example of FIG. 4, the logic threshold value of the inverter IV1 is set to VTA and the logic threshold value of the inverter IV2 is set to VTB. In this example, the logic threshold value is set with the relation of VTA>VTB.

In this case, the logic threshold value of the inverter is appropriately set, thereby forming the delay of T/4 [s] as shown in FIG. 5.

[Second Configuration Example of the Delay Circuit]

Figure 7:
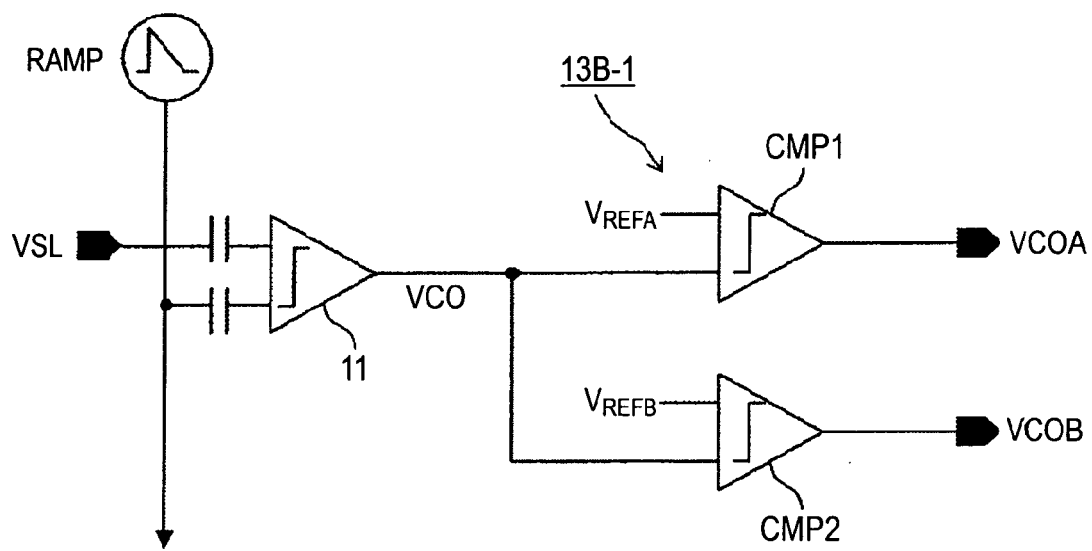
FIG. 7 explains a second configuration example of the delay circuit according to the embodiment.

FIG. 7 explains a second configuration example of the delay circuit according to the embodiment.

Figure 8:
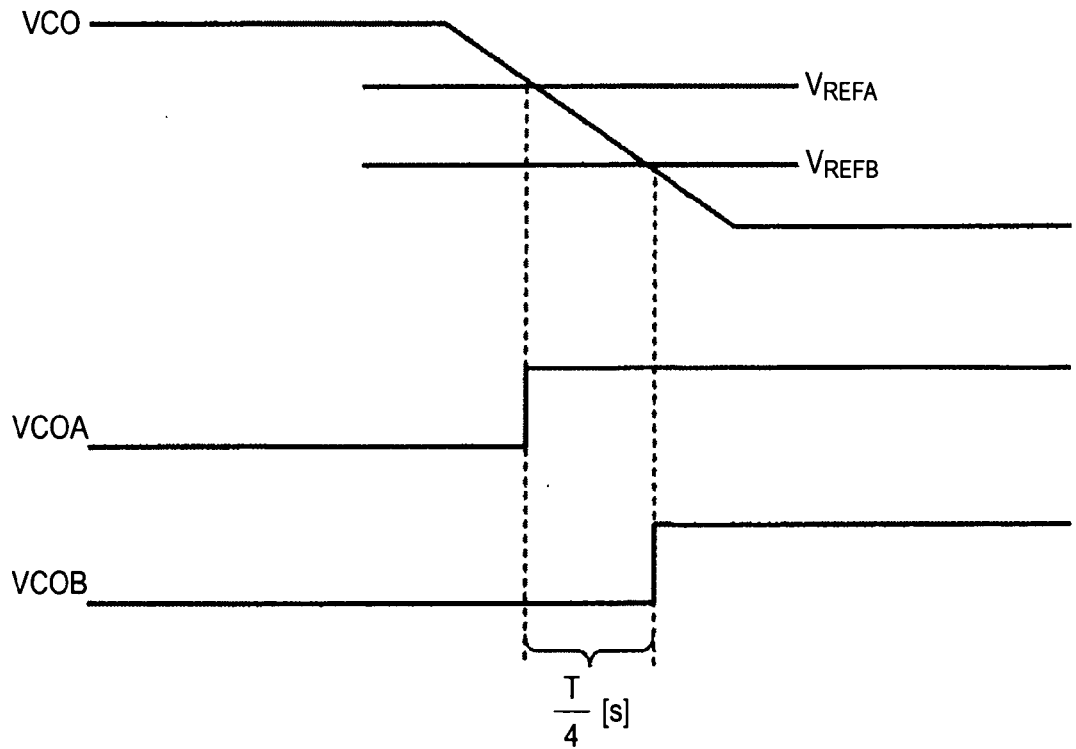
FIG. 8 is a diagram showing operation waveforms obtained when the delay circuit of FIG. 7 is applied.

FIG. 8 is a diagram showing operation waveforms obtained when the delay circuit of FIG. 7 is applied.

A delay circuit 13B-1 of FIG. 7 is formed as a circuit generating delay difference by using comparators CMP1, CMP2 having different threshold voltages.

The output signal VCO of the comparator 11 is applied to one of each of the comparators CMP1, CMP2 having difference input and threshold voltages $V_{REFA}$, $V_{REFB}$ are applied to the other input of each of the comparators CMP1, CMP2.

Also in this case, the threshold voltage is appropriately applied by using the fact that the waveform variation of the output signal VCO by comparison between the reference signal RAMP and the pixel signal VSL in the comparator 11 is extremely gradual, thereby forming the delay of T/4 [s] as shown in FIG. 8 in the same manner as the above.

[Second Configuration Example of the Delay Circuit]

Figure 9:
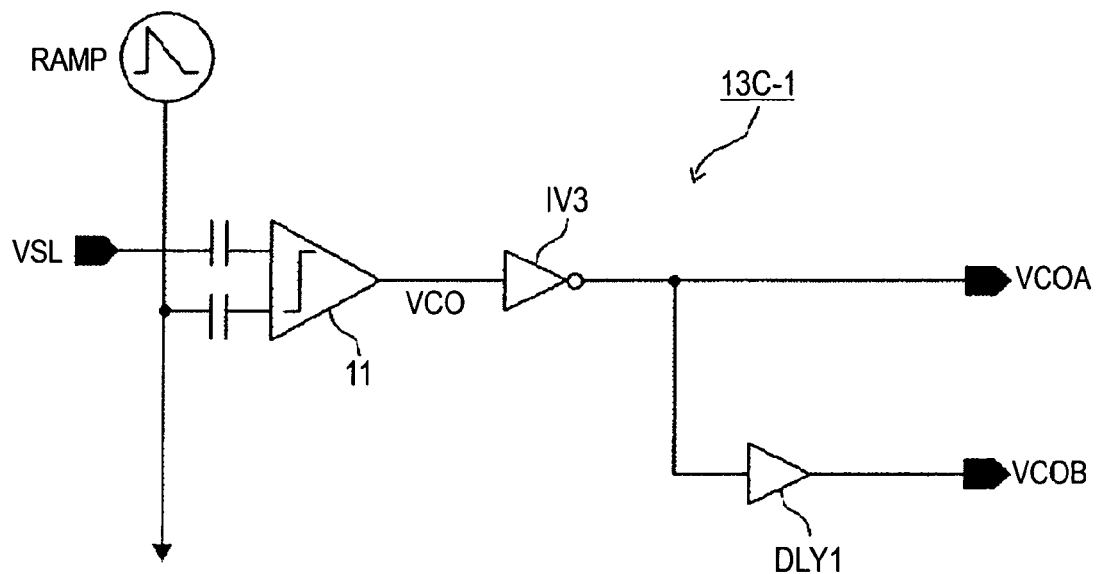
FIG. 9 explains a third configuration example of the delay circuit according to the embodiment.

FIG. 9 explains a third configuration example of the delay circuit according to the embodiment.

Figure 10:
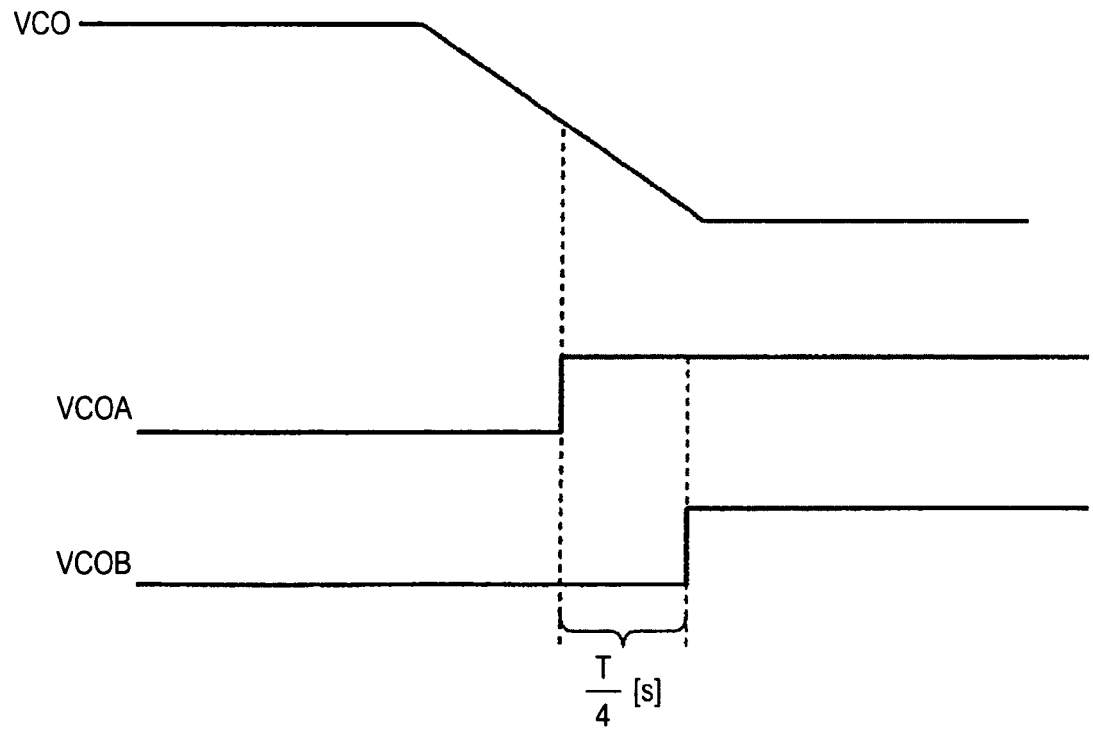
FIG. 10 is a diagram showing operation waveforms obtained when the delay circuit of FIG. 9 is applied.

FIG. 10 is a diagram showing operation waveforms obtained when the delay circuit of FIG. 9 is applied.

A delay circuit 13C-1 of FIG. 9 is a circuit applying the second method, which is formed as the circuit in which a delay element DLY1 is directly sandwiched between paths generating delay signals VCOA, VCOB.

In the delay circuit 13C-1 of FIG. 9, an inverter IV3 is arranged on the output side of the comparator 11 and an output of the inverter IV3 is used as the signal VCOA and the signal obtained by delaying the output of the inverter is used as the signal VCOB.

The delay element DLY1 can apply some configuration methods such as an inverter chain or an NAND chain.

Also in the above configuration, the delay amount is approximately set, thereby forming the delay of T/4 [s] as shown in FIG. 10.

Figure 11:
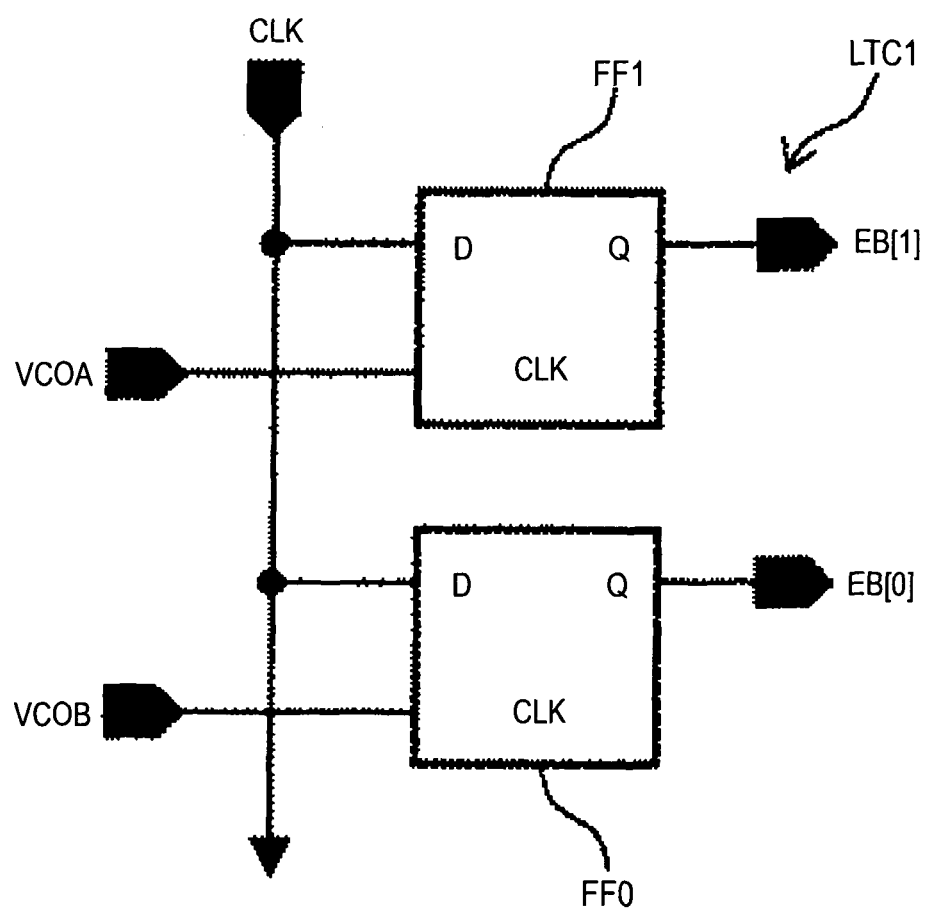
FIG. 11 is a diagram showing a configuration example of a latch in the TDC according to the first embodiment.

FIG. 11 is a diagram showing a configuration example of a latch in the TDC according to the first embodiment.

A latch LTC1 includes flip-flops FF1, FF0.

The flip-flop FF1 latches the clock signal CLK in synchronization with the signal VCOA outputted from the delay circuit 13-1.

The flip-flop FF1 stores the latched value as an extended code EB [1] indicating phase information.

The flip-flop FF0 latches the clock signal CLK in synchronization with the signal VCOB outputted from the delay circuit 13-1 with delay time difference with respect to the signal VCOA.

The flip-flop FF0 stores the latched value as an extended code EB [0] indicating phase information.

The latch & decode unit 13-2 decodes the extended codes EB [1], EB [0] stored in the flip-flops FF1, FF0 to obtain the A/D conversion result smaller than the clock cycle.

As described above, when the frequency of the clock signal CLK is f [Hz] and the cycle thereof is T [s] in the integrating A/D converter 10, it is necessary that there are $2^{n-1}$ signals VCO having the delay time difference and that the delay interval therebetween is $T/2^n$ [s] in the case where n-bit resolution is desired to be obtained in the TDC 13.

When 2-bit resolution is obtained, signals VCO having the delay time difference are two signals VCOA, VCOB, and the delay interval therebetween is T/4 [s] as described above.

Figure 12:
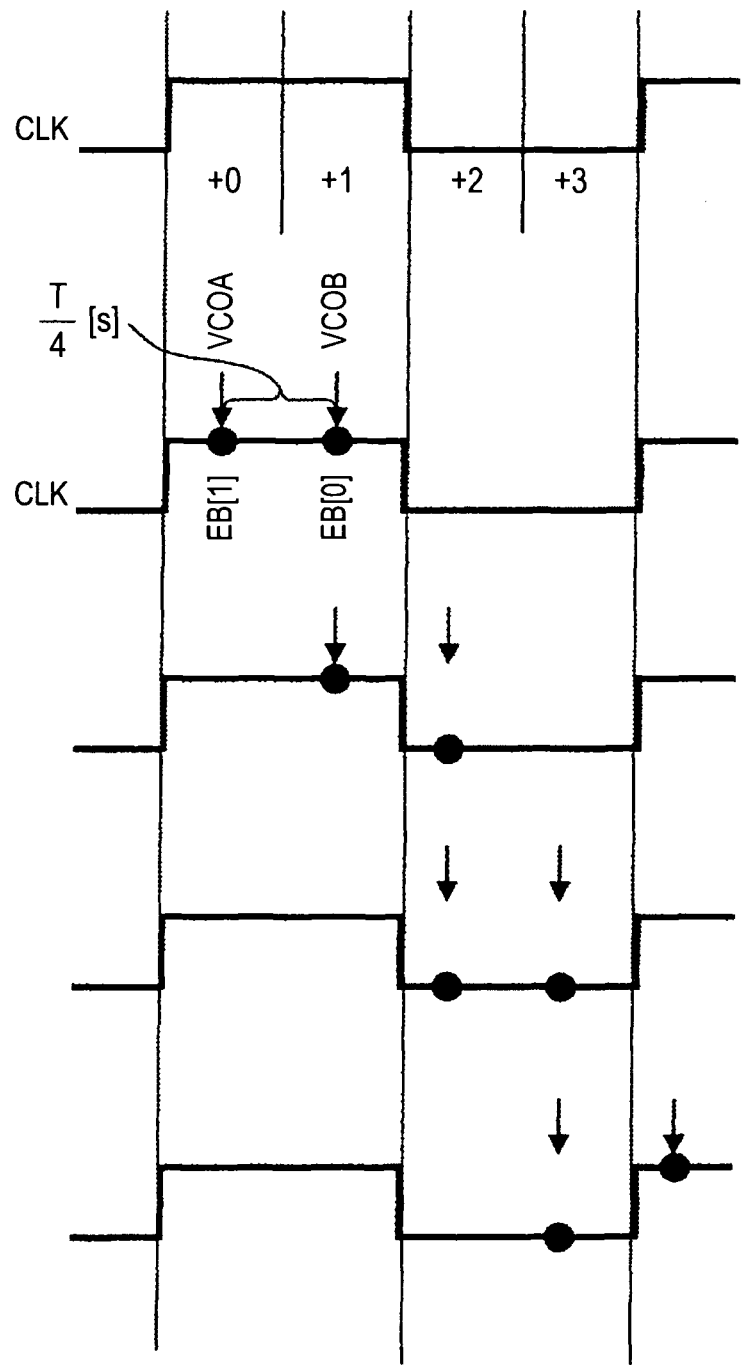
FIG. 12 is a diagram showing detailed principles for obtaining phase information of the clock signal CLK by the latch timing of the clock signal CLK by the signals VCOA, VCOB having delay time difference and the extended codes as an example of obtaining 2-bit resolution.

FIG. 12 is a diagram showing detailed principles for obtaining phase information of the clock signal CLK by the latch timing of the clock signal CLK by the signals VCOA, VCOB having delay time difference and the extended codes as an example of obtaining 2-bit resolution.

The delay interval between the signal VCOA and the signal VCOB is constantly T/4 [s], and there may be four combinations of the extended codes EB [1], EB [0] latched by the signals VCOA, VCOB in accordance with the latch timing of the signal VCOA.

FIG. 13 is a chart collectively showing combinations of extended codes and values to be decoded when 2-bit resolution is obtained.

Four pieces of different phase information are obtained to thereby obtain $2^2$=2-bit resolution.

In the example of FIG. 13, when the extended codes EB [1], EB [0] are [1, 1], the decode value is "00".

When the extended codes EB [1], EB [0] are [1, 0], the decode value is "01".

When the extended codes EB [1], EB [0] are [0, 0], the decode value is "10".

When the extended codes EB [1], EB [0] are [0, 1], the decode value is "11".

Correspondence between the extended codes EB [1], EB [0] and decode values is not limited to the example. In the case of a previous-counting method in which the counting operation of the counter is stopped triggered by inversion of the output signal VCO from the comparator, the correspondence will be the example shown in the paragraph [0041]. However, in the case of an after-counting method in which the counting operation of the counter is started triggered by inversion of the output signal VCO from the comparator, correspondence between combinations EB [1], EB [0] and decode values +0 to +3 will be reverse such as decode values +3 to +0.

As described above, the reference clock itself is one in the first embodiment and the signal after comparison result of the comparator 11 is delayed and the latch timing is delayed to thereby obtain phase information.

In the first embodiment, the method of substantially increasing the resolution, namely, the method of acquiring phase information is different from the common integrating A/D converter.

Accordingly, it is not necessary to distribute plural clocks with shifted phases and the method is advantageous from a viewpoint of power consumption.

Additionally, as the circuit is a so-called event-driven circuit in which the circuit is operated triggered by the timing when the signal VCO as the comparison result is changed, current is consumed only when being operated, therefore, the resolution can be increased extremely efficiently.

2. Second Embodiment

Figure 14:
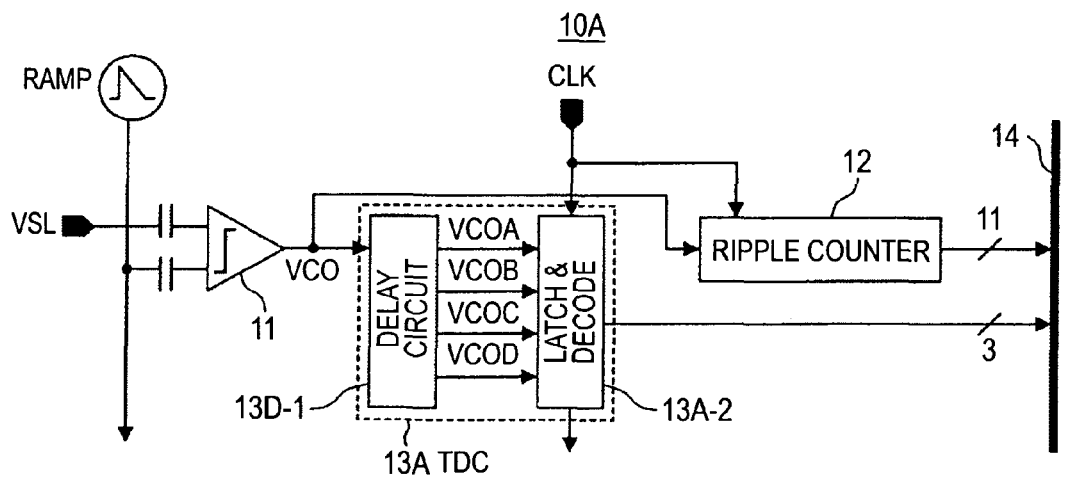
FIG. 14 is a diagram showing a configuration example of an integrating A/D converter according to a second embodiment of the invention.

FIG. 14 is a diagram showing a configuration example of an integrating A/D converter according to a second embodiment of the invention.

An A/D converter 10A according to the second embodiment is different from the A/D converter 10 according to the first embodiment in a point that the resolution of a TDC 13A is extended from 2-bit to 3-bit.

In response to the above, signals having fixed delay time difference outputted from a delay circuit 13D-1 included in the TDC 13A are four signals VCOA, VCOB, VCOC and VCOD.

When 3-bit resolution is obtained as in this case, signals VCO having the delay time difference are four signals VCOA, VCOB, VCOC and VCOD, and the delay interval therebetween is T/8 [s].

A latch & decode unit 13A-2 latches the clock signal CLK in synchronization with the signals VCOA, VCOB, VCOC and VCOD outputted from the delay circuit 13D-1 with delay time difference.

The latch & decode unit 13A-2 stores the latched values as extended codes EB [3], EB [2], EB [1] and EB [0] indicating phase information.

The latch & decode unit 13A-2 decodes the stored extended codes EB [3], EB [2], EB [1] and EB [0] to thereby obtain the A/D conversion result smaller than the clock cycle.

Figure 15:
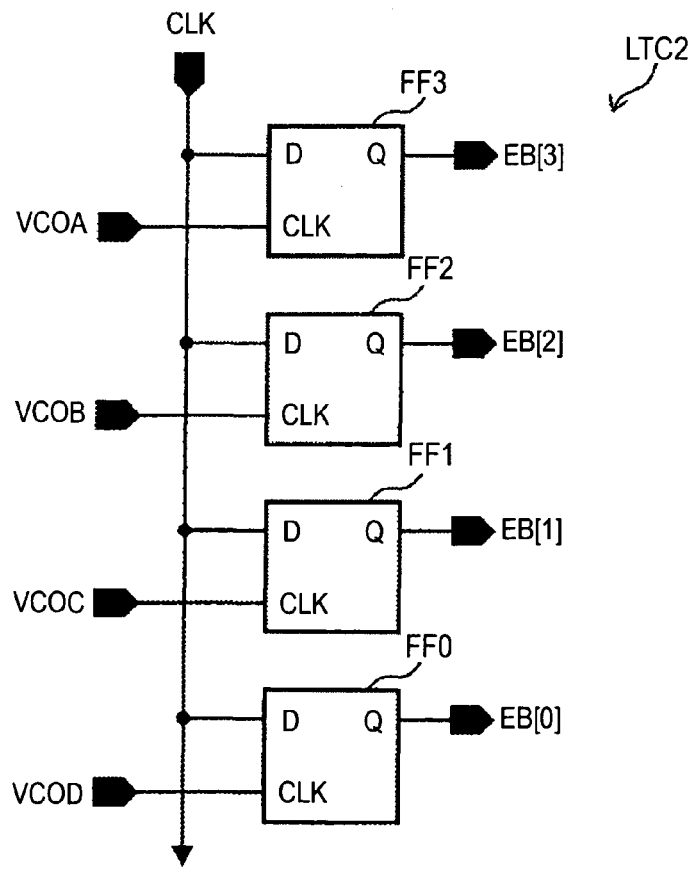
FIG. 15 is a diagram showing a configuration example of a latch in the TDC according to the second embodiment.

FIG. 15 is a diagram showing a configuration example of a latch in the TDC according to the second embodiment.

A latch LTC2 of FIG. 15 includes flip-flops FF3, FF2, FF1 and FF0.

The flip-flop FF3 latches the clock signal CLK in synchronization with the signal VCOA outputted from the delay circuit 13D-1.

The flip-flop FF3 stores the latched value as an extended code EB [3] indicating phase information.

The flip-flop FF2 latches the clock signal CLK in synchronization with the signal VCOB outputted from the delay circuit 13D-1.

The flip-flop FF2 stores the latched value as an extended code EB [2] indicating phase information.

The flip-flop FF1 latches the clock signal CLK in synchronization with the signal VCOC outputted from the delay circuit 13D-1.

The flip-flop FF1 stores the latched value as an extended code EB [1] indicating phase information.

The flip-flop FF0 latches the clock signal CLK in synchronization with the signal VCOD outputted from the delay circuit 13D-1.

The flip-flop FF0 stores the latched value as an extended code EB [0] indicating phase information.

The latch & decode unit 13A-2 decodes the extended codes EB [3], EB [2], EB [1] and EB [0] stored in the flip-flops FF3, FF2, FF1 and FF0 to thereby obtain the A/D conversion result smaller than the clock cycle.

Figure 16:
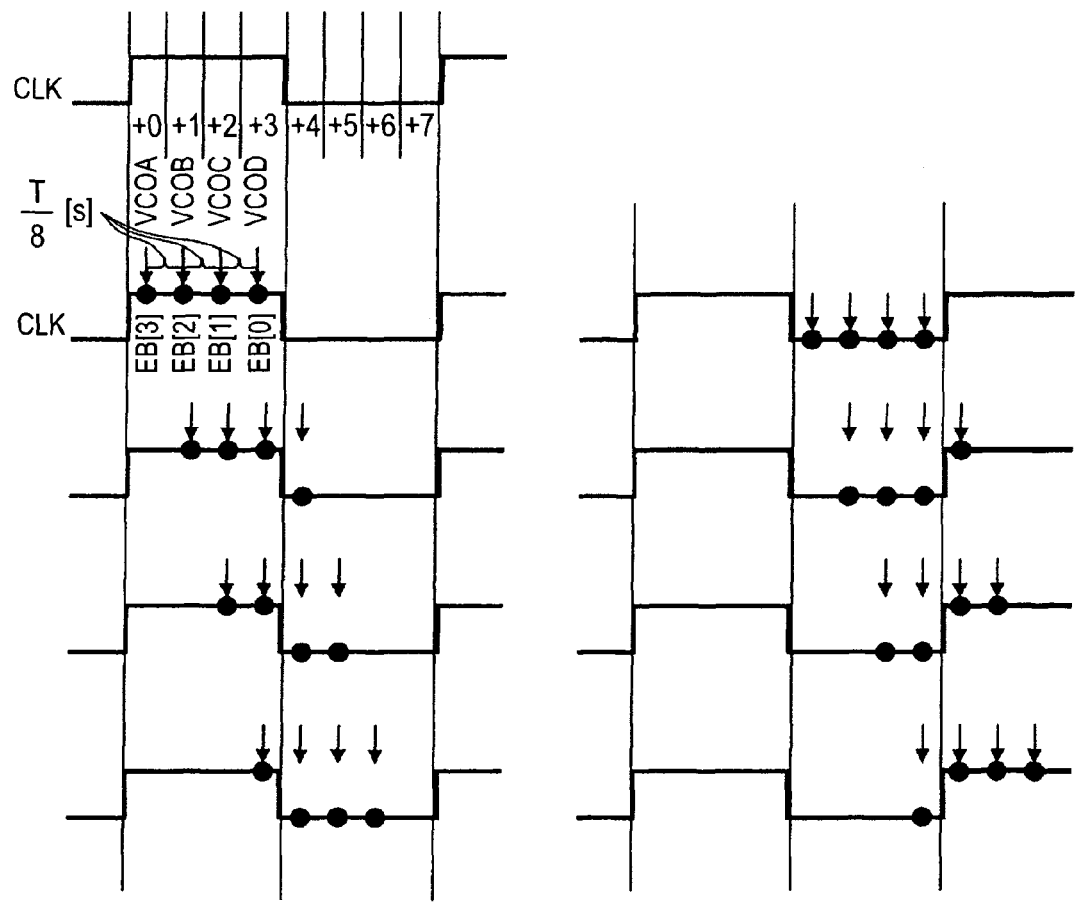
FIG. 16 is a diagram showing detailed principles for obtaining phase information of the clock signal CLK by the latch timing of the clock signal CLK by the signals VCOA, VCOB, VCOC and VCOD having delay time difference and the extended codes as an example of obtaining 3-bit resolution.

FIG. 16 is a diagram showing detailed principles for obtaining phase information of the clock signal CLK by the latch timing of the clock signal CLK by the signals VCOA, VCOB, VCOC and VCOD having delay time difference and the extended codes as an example of obtaining 3-bit resolution.

The delay intervals between the signal VCOA and the signal VCOB, between the signal VCOB and the signal VCOC and between the signal VCOC and the signal VCOD are constantly T/8 [s].

There may be eight combinations of the extended codes EB [3], EB [2], EB [1] and EB [0] latched by the signals VCOA, VCOB, VCOC and VCOD in accordance with the latch timing of the signal VCOA.

Figures 17, 18:
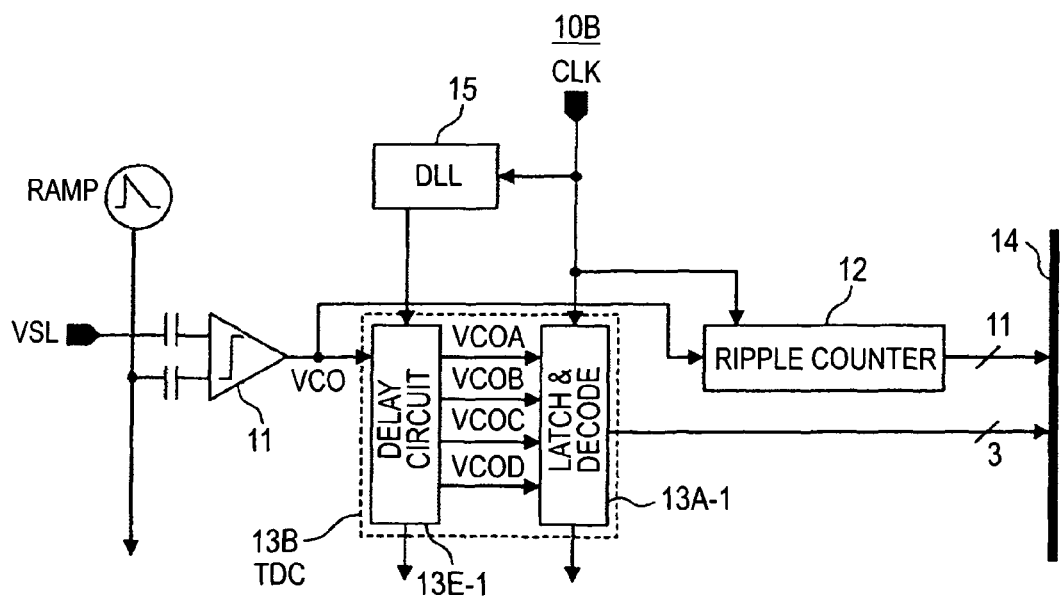
FIG. 17 is a chart collectively showing combinations of extended codes and values to be decoded when 3-bit resolution is obtained.
FIG. 18 is a diagram showing a configuration example of an integrating A/D converter according to a third embodiment of the invention.

FIG. 17 is a chart collectively showing combinations of extended codes and values to be decoded when 3-bit resolution is obtained.

Eight pieces of different phase information are obtained to thereby obtain $2^3=3$-bit resolution.

In the example of FIG. 17, when the extended codes EB [3], EB [2], EB [1] and EB [0] are [1, 1, 1, 1], the decode value is "000".

When the extended codes EB [3], EB [2], EB [1] and EB [0] are [1, 1, 1, 0], the decode value is "001".

When the extended codes EB [3], EB [2], EB [1] and EB [0] are [1, 1, 0, 0], the decode value is "010".

When the extended codes EB [3], EB [2], EB [1] and EB [0] are [1, 0, 0, 0], the decode value is "011".

When the extended codes EB [3], EB [2], EB [1] and EB [0] are [0, 0, 0, 0], the decode value is "100".

When the extended codes EB [3], EB [2], EB [1] and EB [0] are [0, 0, 0, 1], the decode value is "101".

When the extended codes EB [3], EB [2], EB [1] and EB [0] are [0, 0, 1, 1], the decode value is "110".

When the extended codes EB [3], EB [2], EB [1] and EB [0] are [0, 1, 1, 1], the decode value is "111".

Correspondence between the extended codes EB [3], EB [2], EB [1] and EB [0] and decode values is not limited to the example.

According to the second embodiment, the same advantages as the first embodiment can be obtained.

3. Third Embodiment

Third Configuration Example of the Integrating A/D Converter

FIG. 18 is a diagram showing a configuration example of an integrating A/D converter according to a third embodiment of the invention.

An A/D converter 10B according to the third embodiment is different from the A/D converter 10A according to the second embodiment in a point that delay control of a delay circuit 13E-1 of a TDC 13B is performed by using a delay locked loop (DLL) circuit 15.

In the first and second embodiments, delay circuits shown in FIG. 4, FIG. 7 and FIG. 9 are applied.

However, the delay circuits shown in examples of FIG. 4, FIG. 7, and FIG. 9 have a weakness for device variations of transistors, variations of temperature and power supply voltage as well as gain setting of the reference signal RAMP, which includes problems for generating accurate delay difference.

Accordingly, in the third embodiment, control by delay element in a delay circuit 13E-1 using a DLL circuit 15 which resists variations of temperature and power supply voltage, and which does not depend on the gain setting of the reference signal RAMP is achieved.

In an A/D converter 10B, the clock signal CLK is supplied also to the DLL circuit 15 and a voltage $V_{CONT}$ controlling the delay circuit 13E-1 of the TDC 13B is supplied from the DLL 15.

Figure 19:
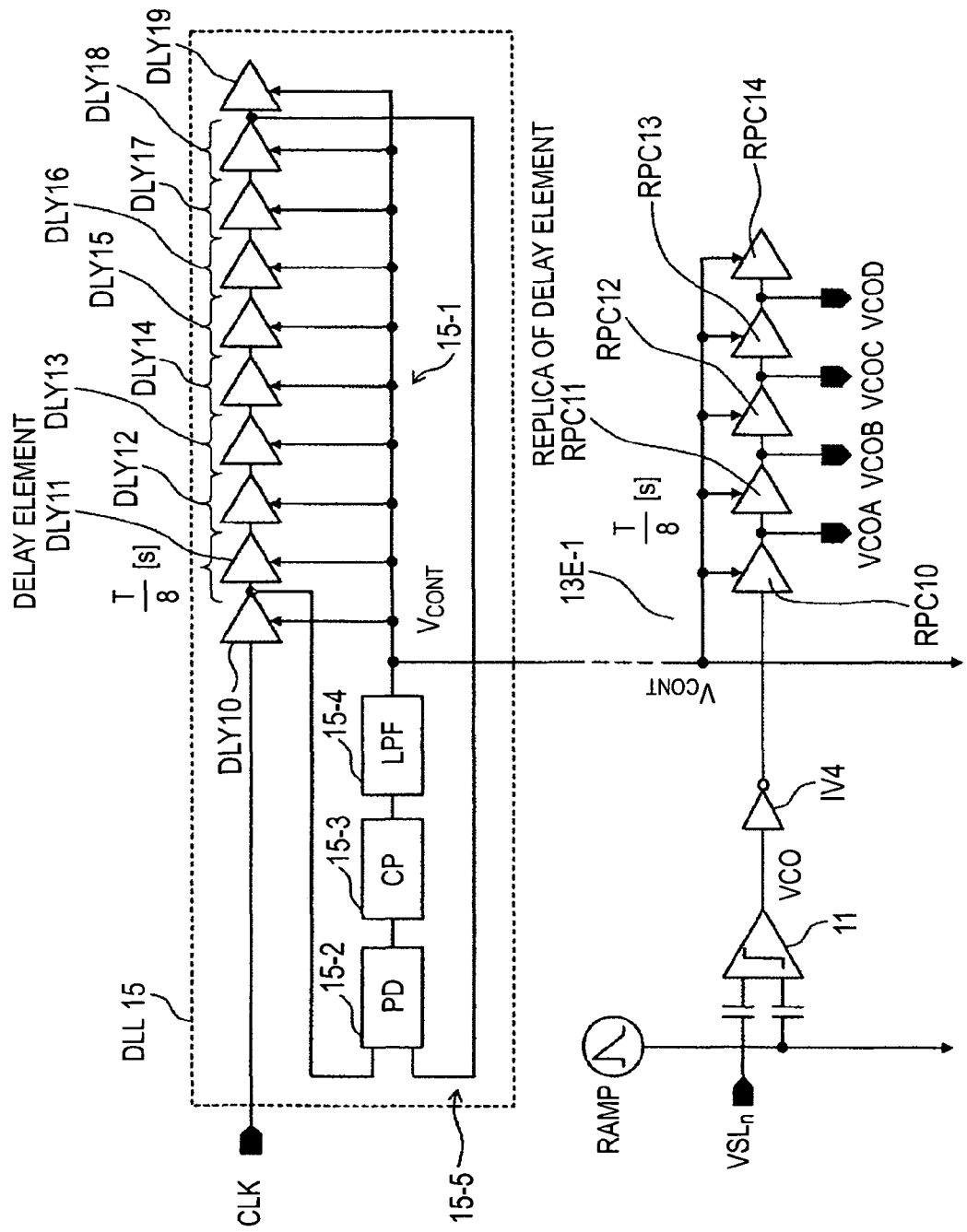
FIG. 19 is a diagram showing a configuration example of the DLL circuit and the TDC according to the third embodiment.

FIG. 19 is a diagram showing a configuration example of the DLL circuit and the delay circuit of the TDC according to the third embodiment.

The DLL circuit 15 includes a delay line 15-1 in which the clock signal CLK is used as input and plural delay elements DLY are connected in cascade.

The DLL circuit 15 includes a phase comparator (PD) 15-2 comparing phase differences between two inputted clocks.

The DLL circuit 15 includes a charge pump (CP) 15-3 moving electric current in a direction of supplying or drawing so as to eliminate phase difference from the comparison result of the phase comparator 15-2.

The DLL circuit 15 includes a low-pass filter (LPF) 15-4 determining characteristics of the control voltage $V_{CONT}$ controlling delay elements by the current amount supplied from the charge pump 15-3.

The DLL circuit 15 includes a delay loop 15-5 having a DLL function outputting a delayed and locked control voltage by comparing phases between the input clock signal CLK and a clock delayed by one cycle through the delay line 15-1.

When the 3-bit resolution of the TDC 13B is obtained, ten delay elements DLY 10 to DLY 19 are connected in cascade including elements for balancing before and after load in the delay line 15-1 for forming a reference of accurate T/8 [s].

An output of the first-stage delay element DLY 10 and an input of the last-stage delay element DLY 19 are inputted into the phase comparator 15-2 to eliminate phase difference and align the cycle, thereby fixing the delay amount of eight stages of delay elements DLY11 to DLY18 which are inserted in the middle of the delay line 15-1 to T/8 [s].

The voltage $V_{CONT}$ controlling the delay elements DLY10 to DLY19 at the operation is taken from the DLL circuit 15 as a control voltage and supplied to the delay circuit 13E-1 of the TDC 13B in the integrating A/D converter 10B.

In the delay circuit 13E-1 of the integrating A/D converter 10B, replicas RPC 10 to RPC 14 are arranged, which have the same circuit configuration and the same design size of transistors as the delay elements DLY 10 to DLY 19 used in the delay line 15-1 of the DLL circuit 15.

The delay circuit 13E-1 generates the delay amount T/8 [s] which is the same as in the DLL circuit 15 by applying the control voltage $V_{CONT}$ supplied from the DLL circuit to the replicas RPC.

Figure 20B:
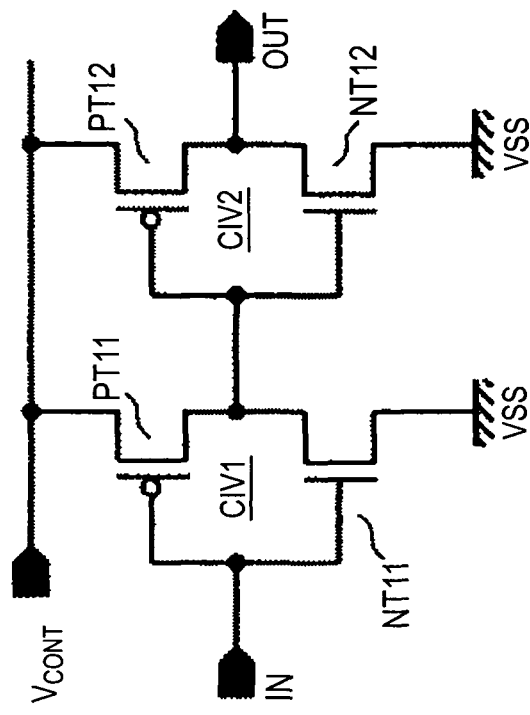
FIGS. 20A and 20B are diagrams showing configuration examples of a delay element in which the delay amount can be controlled by application voltage.
Figure 20A:
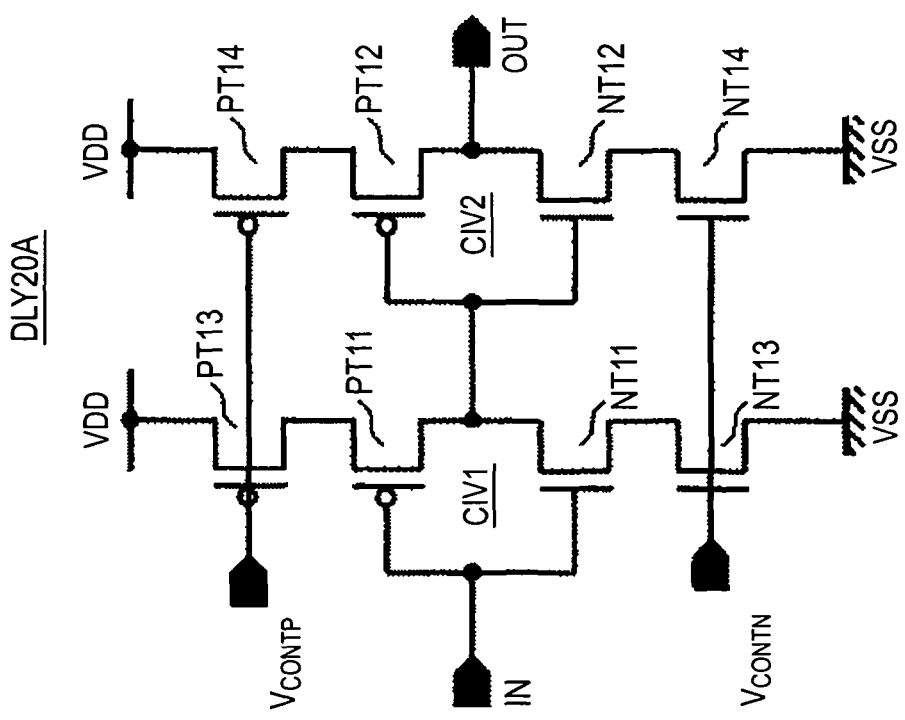

FIGS. 20A and 20B are diagrams showing configuration examples of the delay element in which the delay amount can be controlled by application voltage.

A delay element DLY 20A has a configuration in which transistors as current sources are inserted between a power supply and an NMOS transistor as well as between a power supply and a PMOS transistor included in a CMOS inverter.

Control voltage $V_{CONTP}$, $V_{CONTN}$ are applied to gates of the power source transistors to thereby control the current amount and adjust drive performance of NMOS and PMOS, as a result, the delay amount is changed.

The delay element DLY 20A of FIG. 20A includes PMOS transistors PT11 to PT14 and the NMOS transistors NT11 to NT14.

The PMOS transistor PT11 and the NMOS transistor NT11 form a CMOS inverter CIV1 in which drains of the transistors are connected to each other and the output signal VCO of the comparator 11 is inputted to gates of the transistors through an inverter IV4.

The PMOS transistor PT12 and the NMOS transistor NT12 form a CMOS inverter CIV2 in which drains of the transistors are connected to each other and an output signal of the CMOS inverter CIV1 is inputted to gates of the transistors.

The PMOS transistors PT13, PT14 to be the current source are inserted between sources of the PMOS transistors PT11, PT12 and the power source VDD, respectively.

The NMOS transistors NT13, NT14 to be the current source are inserted between sources of the NMOS transistors NT11, NT12 and the reference potential VSS, respectively.

A control voltage $V_{CONTP}$ is applied to gates of the PMOS transistors PT13, PT14 and a control voltage V CONTN is applied to gates of the NMOS transistors NT13, NT14.

According to the above, the current amounts of the CMOS inverters CIV1, CIV2 are controlled and drive performances of PMOS and NMOS are adjusted to change the delay amount in the delay element DLY 20A.

A delay element DLY 20B of FIG. 20B has a configuration in which power supply voltage of the CMOS inverters CIV1, CIV2 is directly the control voltage $V_{CONT}$, which controls the delay amount of the inverters CIV1, CIV2 by changing the power supply voltage.

In addition to the configurations shown as the above, many kinds of configurations of the delay elements which can control the delay amount are known, and the delay element necessary for the configuration of the proposed integrating A/D converter is not limited to the configuration shown as the embodiments.

As described above, the following advantages can be obtained by the integrating A/D converter according to the embodiment.

The A/D conversion having higher resolution can be realized without increasing the clock frequency.

As there is no trade-off between speeding up the reference clock and prolongation of the A/D conversion period, the embodiment is efficient in speeding up, high accuracy and lower power consumption. For example, when the present configuration is used while maintaining the resolution, the bit number which should be counted by a higher-order ripple counter can be reduced, therefore, it is also possible to increase the frame rate by reducing the A/D conversion period.

Additionally, the A/D converter having good performance resisting variations of power supply voltage and temperature with reduced DNL as characteristics of A/D conversion can be provided by using the DLL.

The system uses only one reference clock itself, which is different from the system of taking phase difference information by using plural clocks having different phase differences, therefore, current consumption for distributing the clock in the column can be suppressed.

In the A/D converter in the column, the delay circuit of the TDC is not operated normally and is operated just once only when the signal VCO of the comparison result operates. The steady current consumption does not occur as the operation is event driven. Accordingly, increase of current consumption of the TDC added for increasing the resolution is extremely small.

4. Fourth Embodiment

Entire Configuration Example of a Solid-State Imaging Device

Figure 21:
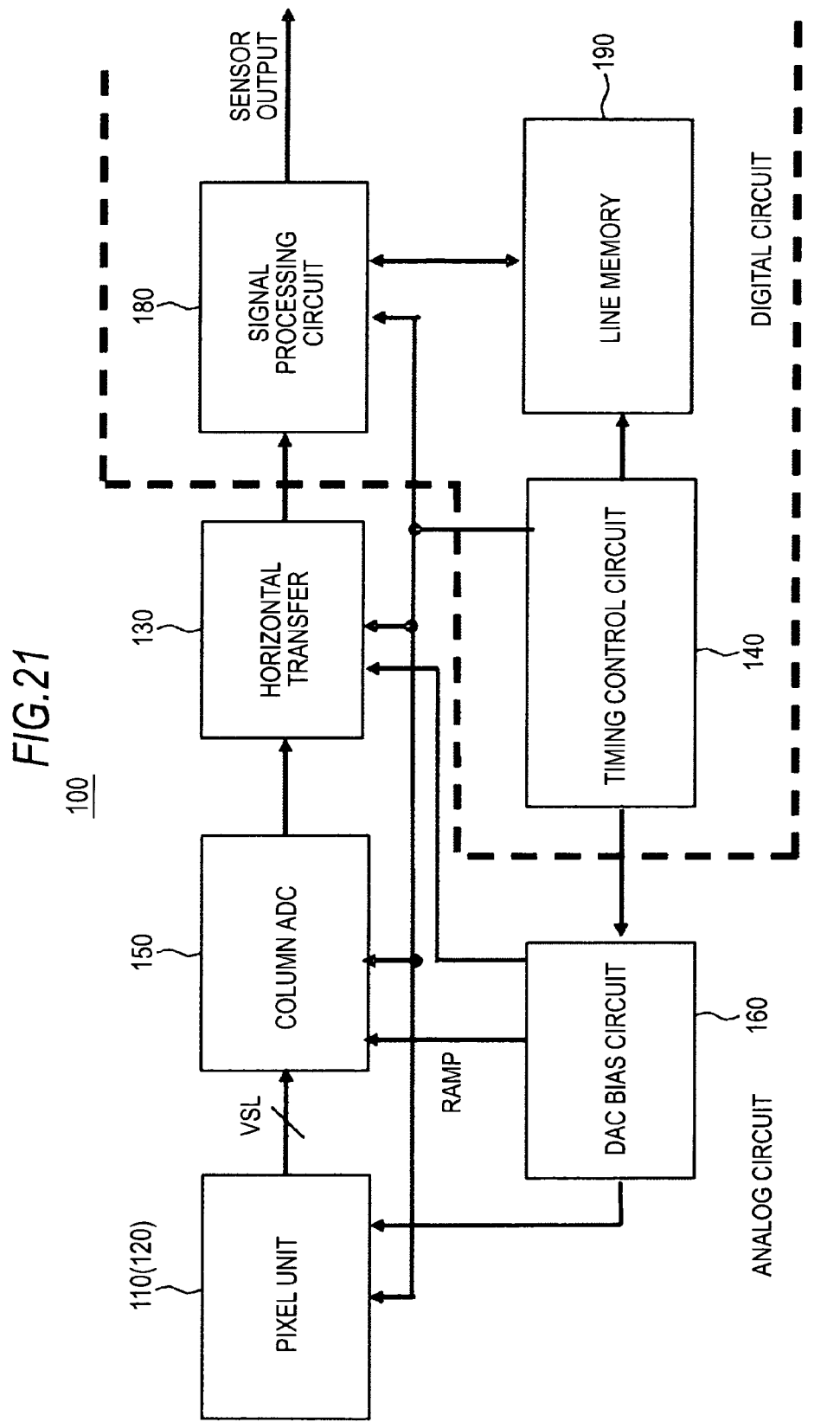
FIG. 21 is a block diagram showing a configuration example of a column-parallel ADC mounted solid-state imaging device (CMOS image sensor) according to a fourth embodiment.

FIG. 21 is a block diagram showing a configuration example of a column-parallel ADC mounted solid-state imaging device (CMOS image sensor) according to a fourth embodiment of the invention.

Figure 22:
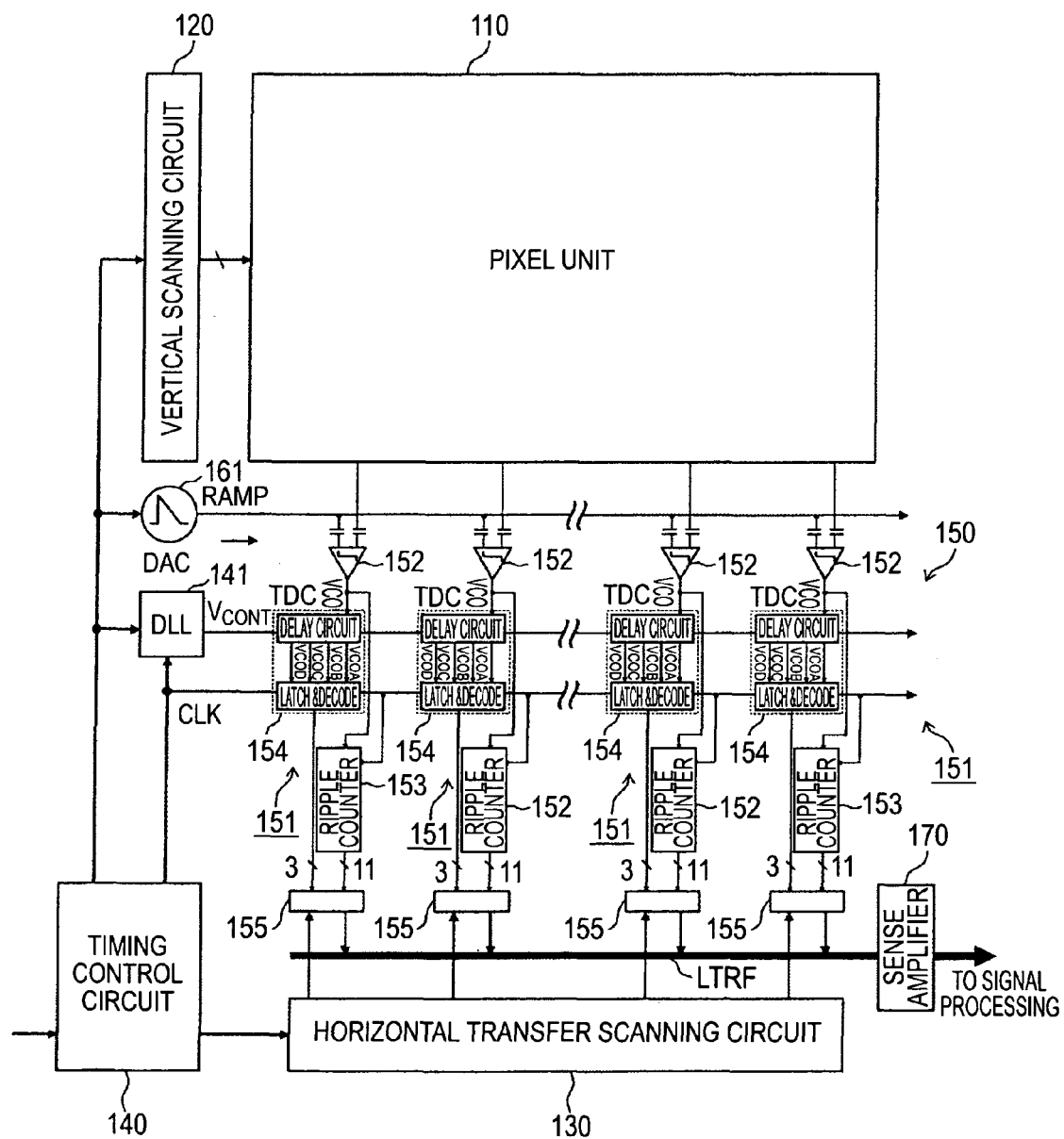
FIG. 22 is a block diagram more specifically showing an ADC group in the column-parallel ADC mounted solid-state imaging device (CMOS image sensor) of FIG. 21.

FIG. 22 is a block diagram more specifically showing an ADC group in the column-parallel ADC mounted solid-state imaging device (CMOS image sensor) of FIG. 21.

A solid-state imaging device 100 includes a pixel unit 110 as an imaging unit, a vertical scanning circuit 120, a horizontal transfer scanning circuit 130, a timing control circuit 140 and an A/D converter (ADC) group 150 as a pixel signal reading unit. The pixel signal reading unit includes the vertical scanning circuit 120 and so on.

The solid-state imaging device 100 includes a DAC bias circuit 160 including a DA converter 161, an amplifier circuit (S/A) 170, a signal processing circuit 180 and a line memory 190.

Among these components, the pixel unit 100, the vertical scanning circuit 120, the horizontal transfer scanning circuit 130, the ADC group 150, the DAC bias circuit 160 and the amplifier circuit (S/A) 170 are formed by analog circuits.

On the other hand, the timing control circuit 140, the signal processing circuit 180 and the line memory 190 are formed by digital circuits.

The timing control circuit 140 is configured by including a DLL circuit 141, however, in FIG. 22, the DLL circuit 141 is shown separated from the timing control circuit 140 so as to correspond to the configuration of FIG. 18.

The solid-state imaging device 100 is formed as an image sensor in a column AD system in which integrating A/D converters are arranged in column-parallel, which are characterized by delay element control using the DLL control of FIG. 18 which can increase the resolution by 3-bit by using the delay line.

The integrating A/D converters are arranged in column parallel with respect to respective columns of a pixel array. The slope of the reference signal RAMP is generated by the DAC, which is supplied to the whole columns.

The DLL circuit is arranged at the end of the columns in the same manner and the control voltage is supplied to the whole columns.

In the pixel unit 110, pixels each having a photodiode and a pixel amplifier are arranged in a matrix state.

Figure 23:
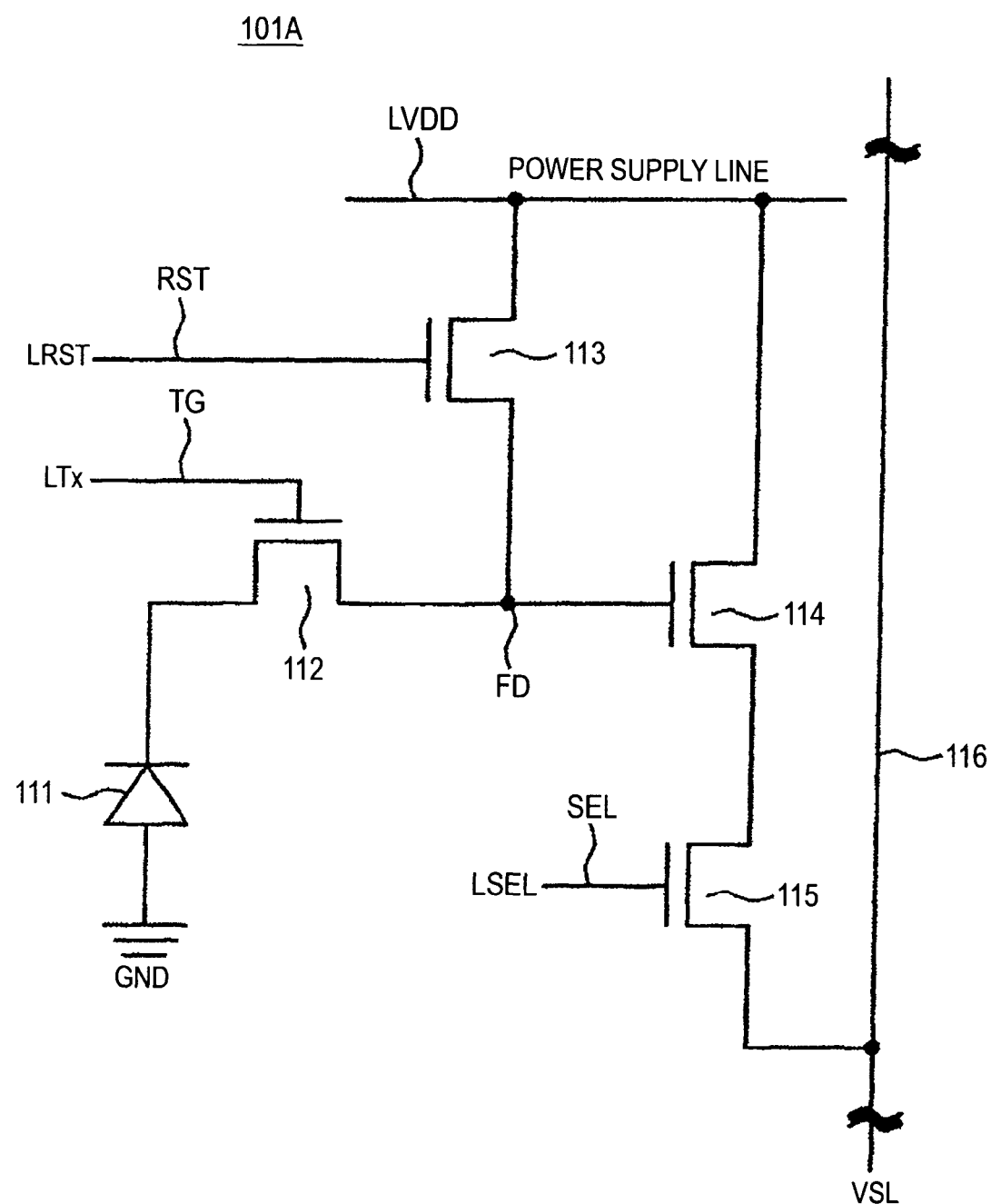
FIG. 23 is a diagram showing an example of a pixel in the CMOS image sensor including four transistors according to the embodiment.

FIG. 23 is a diagram showing an example of a pixel in the CMOS image sensor including four transistors according to the embodiment.

A pixel circuit 101A includes, for example, a photodiode 111 as a photoelectric conversion device.

The pixel circuit 101A includes the photodiode 111 as one photoelectric conversion element.

The pixel circuit 101A includes four transistors which are a transfer transistor 112 as a transfer element, a reset transistor 113 as a reset element, an amplifier transistor 114 and a selection transistor 115 as active elements with respect to one photodiode 111.

The photodiode 111 photoelectrically converts incident light into charges (electrons in this case) corresponding to the light amount.

The transfer transistor 112 is connected between the photodiode 111 and a floating diffusion FD as an output node.

The transfer transistor 112 transfers electrons photoelectrically converted in the photodiode 111 to the floating diffusion FD when a drive signal TG is given to a gate (transfer gate) thereof through a transfer control line LTx.

The reset transistor 113 is connected between a power supply line LVDD and the floating diffusion FD.

The reset transistor 113 resets a potential of the floating diffusion FD to a potential of the power supply line LVDD when a reset RST is given to a gate thereof through a reset control line LRST.

A gate of the amplification transistor 114 is connected to the floating diffusion FD. The amplification transistor 114 is connected to a vertical signal line 116 through the selection transistor 115, forming a source follower together with a constant current source which is outside the pixel unit.

When a control signal (an address signal or a selection signal) SEL is given to a gate of the selection transistor 115 through a selection control line LSEL, the selection transistor 115 is turned on.

When the selection transistor 115 is turned on, the amplification transistor 114 amplifies the potential of the floating diffusion FD and outputs voltage corresponding to the potential to the vertical signal line 116. The voltage outputted from respective pixels is outputted to the ADC group 150 as the pixel signal reading circuit through the vertical signal line 116.

These operations are performed with respect to respective pixels of one row at the same time as respective gates of, for example, the transfer transistor 112, the reset transistor 113 and the selection transistor 115 are connected in units of rows.

The reset control line LRST, the transfer control line LTx and the selection control line LSEL arranged in the pixel unit 110 are wired as a set with respect to each row of the pixel arrangement.

The reset control line LRST, the transfer control line LTx and the selection control line LSEL are driven by the vertical scanning circuit 120 as the pixel drive unit.

In the solid-state imaging device 100, the timing control circuit 140 generating an internal clock as a control circuit sequentially reading signals of the pixel unit 110, the vertical scanning circuit 120 controlling row addresses and row scanning and the horizontal transfer scanning circuit 130 controlling column addresses and column scanning are arranged.

The timing control circuit 140 generates timing signals necessary for signal processing in the pixel unit 110, the vertical scanning circuit 120, the horizontal transfer scanning circuit 130, the A/D converter group (ADC group) 150, the DAC bias circuit 160, the signal processing circuit 180 and the line memory 190.

In the pixel unit 110, video and screen images are photoelectrically converted in pixel-row units by accumulating and discharging photons using, for example, a line shutter to thereby output an analog signal VSL to the ADC group.

In the ADC group 150, APGA integrating ADC and digital CDS are performed to analog output of the pixel unit 110 in ADC blocks (respective column units) respectively by using the reference voltage RAMP from the DA converter (DAC) 161 to thereby output several-bit digital signals.

Figure 24:
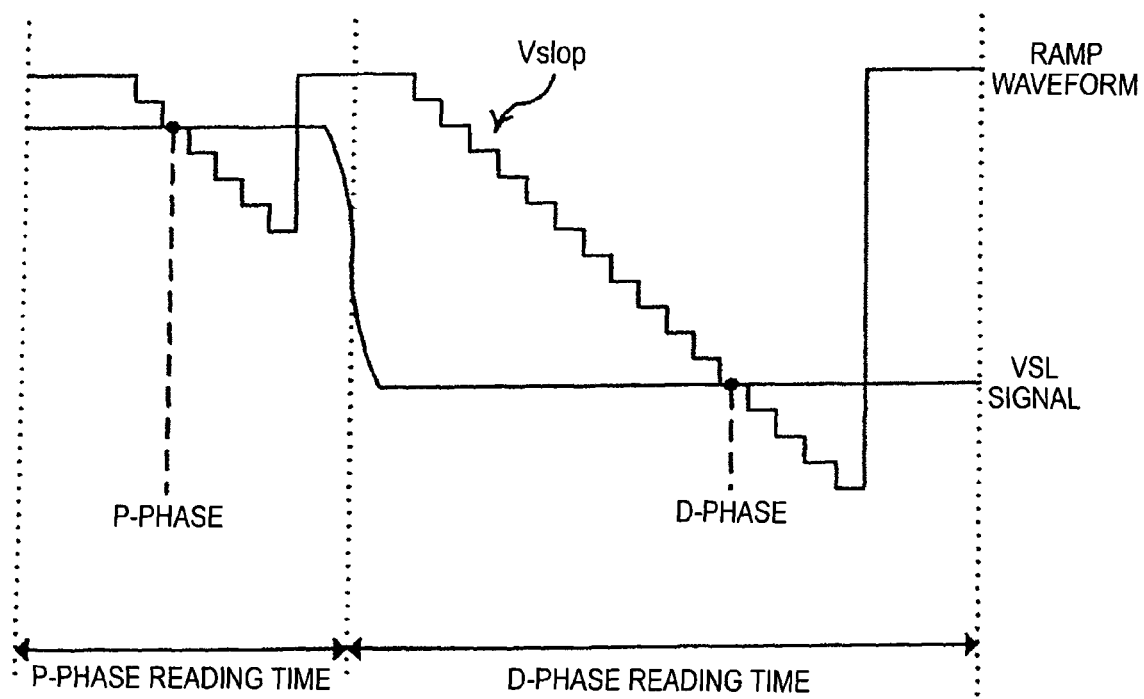
FIG. 24 is a diagram showing an example of a ramp (RAMP) waveform generated by a D/A converter of FIG. 21 and FIG. 22 and operation timing of ADC.

FIG. 24 is a diagram showing an example of a ramp (RAMP) waveform generated by the DAC of FIG. 21 and FIG. 22 and operation timing of ADC.

In the ADC group 150, plural columns of integrating A/D converter 10B shown in FIG. 18 are arranged.

The DAC 161 generates the reference voltage RAMP which is a ramp (RAMP) waveform sloping in a staircase pattern as shown in FIG. 24.

Each A/D converter 151 includes a comparator 152, a higher-order bit counter 153, a TDC (Time-to-Digital Converter) 154 and a logic circuit 155.

The comparator 152, the higher-order bit counter 153 and the TDC 154 have the same functions as the comparator 11, the higher-order bit counter 12 and the TDC 13 of FIG. 18, therefore, the detailed explanation thereof is omitted here.

The logic circuit 155 adds higher-order bits (for example, 11 bits) generated in the higher-order bit counter 153 to lower-order bits (for example, 3 bits) generated in the lower-order bit TDC 154 and connects them together.

Outputs of respective logic circuits 155 are connected to horizontal transfer lines LTRF.

Additionally, k-pieces of amplifier circuit 170 corresponding to the horizontal transfer lines LTRF and the signal processing circuit 180 are arranged.

After the above A/D conversion period is completed, data by the logic circuits 154 is transferred to the horizontal transfer lines LTRF by the horizontal transfer scanning circuit 130 and inputted to the signal processing circuit 180 through the amplifier circuits 170 to generate a two-dimensional image by given signal processing.

In the horizontal transfer scanning circuit 130, several-channel simultaneous parallel transfer is performed for securing transfer speed.

In the timing control circuit 140, timings necessary for signal processing at respective blocks such as the pixel unit 110 and the ADC group 150 are generated.

In the signal processing circuit 180 in the subsequent stage, correction of vertical line defects and point defects and signal clamping are performed by signals stored in the line memory 190, or digital signal processing such as parallel-serial conversion, compression, encoding, addition, averaging and intermittent operation is performed.

In the line memory 190, digital signals transmitted in pixel row units are stored.

In the solid-state imaging device 100 according to the embodiment, a digital output of the signal processing circuit 180 is transmitted as an input of ISP or a baseband LSI.

The CMOS image sensor 100 as the solid-state imaging device according to the second embodiment includes the A/D converter (ADC) 10B of FIG. 18.

Accordingly, the following advantages can be obtained by the solid-state imaging device.

The A/D conversion having higher resolution can be realized without increasing the clock frequency.

As there is no trade-off between speeding up the reference clock and prolongation of the A/D conversion period, the embodiment is effective in speeding up, high accuracy and lower power consumption. For example, when the present configuration is used while maintaining the resolution, the bit number which should be counted by a higher-order ripple counter can be reduced, therefore, it is also possible to increase the frame rate by reducing the A/D conversion period.

Additionally, the A/D converter having good performance resisting variations of power supply voltage and temperature with reduced DNL as characteristics of A/D conversion can be provided by using the DLL.

The system uses only one reference clock itself, which is different from the system of taking phase difference information by using plural clocks having different phase differences, therefore, current consumption for distributing the clock in the column can be suppressed.

In the A/D converter in the column, the delay circuit of the TDC is not operated normally and is operated just once only when the signal VCO of the comparison result operates. The steady current consumption does not occur as the operation is event driven. Accordingly, increase of current consumption of the TDC added for increasing the resolution is extremely small.

The solid-state imaging device having the above advantages can be applied as an imaging device for a digital camera or a video camera.

5. Fifth Embodiment

Configuration Example of a Camera System

Figure 25:
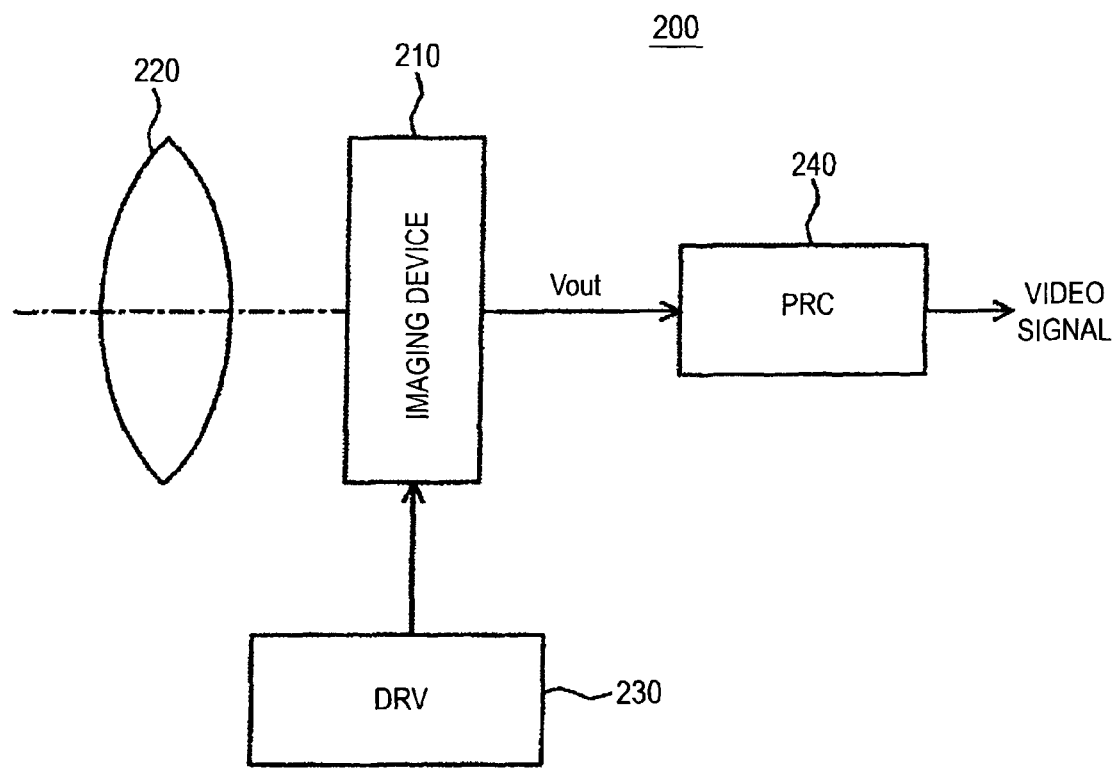
FIG. 25 is a diagram showing a configuration example of a camera system to which the solid-state imaging device according to the embodiment is applied.

FIG. 25 is a diagram showing a configuration example of a camera system to which the solid-state imaging device according to the embodiment is applied.

A camera system 200 includes an imaging device 210 to which the solid-state imaging device 100 according to the embodiment can be applied as shown in FIG. 25.

The camera system 200 includes, for example, a lens 220 imaging incident light (image light) on an imaging surface as an optical system introducing incident light (imaging a subject image) to a pixel area of the imaging device 210.

The camera system 200 further includes a drive circuit (DRV) 230 driving the imaging device 210 and a signal processing circuit (PRC) 240 processing output signals of the imaging device 210.

The drive circuit 230 includes a timing generator (not shown) generating various types of timing signals including a start pulse and a clock pulse driving circuits in the imaging device 210, which drives the imaging device 210 by a given timing signal.

The signal processing circuit 240 performs given signal processing to output signals of the imaging device 210.

The image signals processed in the signal processing circuit 240 is recorded in a recording medium such as a memory. The image information recorded in the recording medium is hard-copied by a printer and so on. The image signals processed in the signal processing circuit 240 are reproduced on a monitor such as a liquid crystal display as moving images.

As described above, the above solid-state imaging device 100 is mounted as the imaging device 210 in the imaging apparatus such as the digital still camera to realize a highly accurate camera.

The present application contains subject matter related to that disclosed in Japanese Priority Patent Application JP 2010-126069 filed in the Japan Patent Office on Jun. 1, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An integrating analog/digital (A/D) converter comprising:
    a comparator configured to compare an input voltage to a reference voltage to produce an output signal, wherein the reference voltage has a ramp waveform, wherein a voltage value of the reference voltage linearly varies with time;
    a higher-order bit counter configured to start a counting operation at a first inversion of the output signal of the comparator, to stop the counting operation at a second inversion of the output signal of the comparator, and to output higher order bits by performing the counting operation in a cycle of a clock signal; and
    a time-to-digital converter configured to receive the output signal of the comparator, to generate a plurality of signals obtained by respectively delaying the output signal of the comparator, wherein the plurality of signals are used to control a latching of phase information of the clock signal and to store the latched values as extended codes, and to decode the extended codes to output lower order bits having higher resolution than the clock cycle.

2. The integrating A/D converter according to claim 1, wherein the time-to-digital converter includes a delay unit configured for the delaying of the output signal of the comparator, and
    the delay unit includes a plurality of inverters having different logic thresholds, wherein the plurality of inverters are connected in parallel to output of the comparator.

3. The integrating A/D converter according to claim 1, wherein the time-to-digital converter includes a delay unit configured for the delaying of the output signal of the comparator, and
    the delay unit includes a plurality of comparators having different threshold voltages, wherein the plurality of comparators are connected in parallel to output of the comparator.

4. The integrating A/D converter according to claim 1, wherein the time-to-digital converter includes a delay unit configured for the delaying of the output signal of the comparator, and
    the delay unit includes at least one delay element, wherein the at least one delay element is connected in parallel to output of the comparator.

5. The integrating A/D converter according to claim 1, further comprising:
    a delay locked loop (DLL) circuit including:
        a delay line formed by a plurality of first delay elements connected in cascade with respect to a clock input; and
        a delay loop having a function configured to compare a phase of an input clock to a phase of the input clock delayed by one cycle through the delay line and to output a delayed and locked control voltage,
    wherein the time-to-digital converter includes a delay unit configured to delay the output signal of the comparator, and
    the delay unit includes a plurality of second delay elements connected in cascade to the output of the comparator, wherein the delay unit is configured to control a delay amount of the plurality of second delay elements in accordance with the delayed and locked control voltage output by the DLL circuit.

6. The integrating A/D converter according to claim 5, wherein each of the plurality of second delay elements is formed by a replica circuit having the same configuration as one of the plurality of first delay elements.

7. An integrating analog/digital (A/D) conversion method comprising:
    comparing, by a comparator, an input voltage to a reference voltage to produce an output signal, wherein the reference voltage has a ramp waveform, wherein a voltage value of the reference voltage linearly varies with time;
    starting a counting operation by a higher-order bit counter at a first inversion of the output signal of the comparator, stopping the counting operation at a second inversion of the output signal of the comparator, and outputting higher order bits by performing counting in a cycle of a clock signal; and
    performing time-to-digital conversion by generating a plurality of signals obtained by respectively delaying the output signal of the comparator, wherein the plurality of signals are used to control latching of phase information of the clock signal and to store the latched values as extended codes, and decoding the extended codes to output lower order bits having higher resolution than the clock cycle.

8. A solid-state imaging device comprising:
    a pixel unit in which a plurality of pixels configured to perform photoelectric conversion are arranged in a matrix state; and
    a pixel signal reading unit configured to perform reading of pixel signals from the pixel unit,
    wherein the pixel signal reading unit includes integrating analog/digital (A/D) converters configured to convert read analog signals to digital signals so as to correspond to column arrangement of the plurality of pixels, and
    wherein at least one of the integrating A/D converters includes:

a comparator configured to compare an input voltage to a reference voltage to produce an output signal, wherein the reference voltage has a ramp waveform, wherein a voltage value of the reference voltage linearly varies with time, a higher-order bit counter configured to start a counting operation at a first inversion of the output signal of the comparator, to stop the counting operation at a second inversion of the output signal of the comparator, and to output higher order bits by performing the counting operation in a cycle of a clock signal, and a time-to-digital converter configured to receive the output signal of the comparator, to generate a plurality of signals obtained by respectively delaying the output signal of the comparator, wherein the plurality of signals are used to control a latching of phase information of the clock signal and to store the latched values as extended codes, and to decode the extended codes to output lower order bits having higher resolution than the clock cycle.

9. The solid-state imaging device according to claim 8, wherein the time-to-digital converter includes a delay unit configured for the delaying of the output signal of the comparator, and the delay unit includes a plurality of inverters having different logic thresholds, wherein the plurality of inverters are connected in parallel to output of the comparator.

10. The solid-state imaging device according to claim 8, wherein the time-to-digital converter includes a delay unit configured for the delaying of the output signal of the comparator, and the delay unit includes a plurality of comparators having different threshold voltages, wherein the plurality of comparators are connected in parallel to output of the comparator.

11. The solid-state imaging device according to claim 8, wherein the time-to-digital converter includes a delay unit configured for the delaying of the output signal of the comparator, and the delay unit includes at least one delay element, wherein the at least one delay element is connected in parallel to output of the comparator.

12. The solid-state imaging device according to claim 8, further comprising:

a delay locked loop (DLL) circuit including:
 a delay line formed by a plurality of first delay elements connected in cascade with respect to a clock input; and
 a delay loop having a function configured to compare a phase of an input clock to a phase of the input clock delayed by one cycle through the delay line and to output a delayed and locked control voltage, wherein the time-to-digital converter includes a delay unit configured to delay the output signal of the comparator, and the delay unit includes a plurality of second delay elements connected in cascade to the output signal of the comparator, wherein the delay unit is configured to control a delay amount of the plurality of second delay elements in accordance with the delayed and locked control voltage by the DLL circuit.

13. The solid-state imaging device according to claim 12, wherein each of the plurality of second delay elements is formed by a replica circuit having the same configuration as one of the plurality of first delay elements.

14. A camera system comprising:
a solid-state imaging device; and
an optical system configured to image a subject image on the solid-state imaging device, wherein the solid-state imaging device includes:
 a pixel unit in which a plurality of pixels configured to perform photoelectric conversion are arranged in a matrix state, and
 a pixel signal reading unit configured to perform reading of pixel signals from the pixel unit, wherein the pixel signal reading unit includes integrating analog/digital (A/D) converters configured to convert read analog signals to digital signals so as to correspond to column arrangement of the plurality of pixels, and wherein at least one of the integrating A/D converters includes:
 a comparator configured to compare an input voltage to a reference voltage to produce an output signal, wherein the reference voltage has a ramp waveform, wherein a voltage value of the reference voltage linearly varies with time,
 a higher-order bit counter configured to start a counting operation at a first inversion of the output signal of the comparator, to stop the counting operation at a second inversion of the output signal of the comparator, and to output higher order bits by performing the counting operation in a cycle of a clock signal, and
 a time-to-digital converter configured to receive the output signal of the comparator, to generate a plurality of signals obtained by respectively delaying the output signal of the comparator, wherein the plurality of signals are used to control a latching of phase information of the clock signal and to store the latched values as extended codes, and to decode the extended codes to output lower order bits having higher resolution than the clock cycle.

15. The integrating A/D conversion method according to claim 7, further comprising
delaying the output signal of the comparator by a delay unit that includes a plurality of inverters having different logic thresholds, wherein the plurality of inverters are connected in parallel to output of the comparator.

16. The integrating A/D conversion method according to claim 7, further comprising
delaying the output signal of the comparator by a delay unit that includes a plurality of comparators having different threshold voltages, wherein the plurality of comparators are connected in parallel to output of the comparator.

17. The integrating A/D conversion method according to claim 7, further comprising
delaying the output signal of the comparator by a delay unit that includes at least one delay element, wherein the at least one delay element is connected in parallel to output of the comparator.

18. The camera system according to claim 14,
wherein the time-to-digital converter includes a delay unit configured for the delaying of the output signal of the comparator, and the delay unit includes a plurality of inverters having different logic thresholds, wherein the plurality of inverters are connected in parallel to output of the comparator.

19. The camera system according to claim 14,
wherein the time-to-digital converter includes a delay unit configured for the delaying of the output signal of the comparator, and the delay unit includes a plurality of comparators having different threshold voltages, wherein the plurality of comparators are connected in parallel to output of the comparator.

20. The camera system according to claim 14,
wherein the time-to-digital converter includes a delay unit configured for the delaying of the output signal of the comparator, and
the delay unit includes at least one delay element, wherein the at least one delay element is connected in parallel to output of the comparator.

21. The integrating A/D conversion method according to claim 7, further comprising:
comparing, by a delay loop having a delay locked loop (DLL) function, a phase of an input clock to a phase of the input clock delayed by one cycle through a delay line formed by a plurality of first delay elements connected in cascade with respect to a clock input,
outputting a delayed and locked control voltage, and
delaying the output signal of the comparator by a delay unit that includes a plurality of second delay elements connected in cascade to the output signal of the comparator, wherein the delay unit is configured to control a delay amount of the plurality of second delay elements in accordance with the delayed and locked control voltage output by a DLL circuit.

22. The integrating A/D conversion method according to claim 21,
wherein each of the plurality of second delay elements is formed by a replica circuit having the same configuration as one of the plurality of first delay elements.

23. The camera system according to claim 14, further comprising:
a delay locked loop (DLL) circuit including:
a delay line formed by a plurality of first delay elements connected in cascade with respect to a clock input; and
a delay loop having a function configured to compare a phase of an input clock to a phase of the input clock delayed by one cycle through the delay line and to output a delayed and locked control voltage,
wherein the time-to-digital converter includes a delay unit configured to delay the output signal of the comparator, and
the delay unit includes a plurality of second delay elements connected in cascade to the output signal of the comparator, wherein the delay unit is configured to control a delay amount of the plurality of second delay elements in accordance with the delayed and locked control voltage output by the DLL circuit.

24. The camera system according to claim 23,
wherein each of the plurality of second delay elements is formed by a replica circuit having the same configuration as one of the plurality of first delay elements.

* * * * *